(12) United States Patent
Kim et al.

(10) Patent No.: US 11,839,091 B2
(45) Date of Patent: Dec. 5, 2023

(54) THREE-DIMENSIONAL SEMICONDUCTOR MEMORY DEVICE

(71) Applicant: SAMSUNG ELECTRONICS CO., LTD., Suwon-si (KR)

(72) Inventors: Junhyoung Kim, Seoul (KR); Kwang-Soo Kim, Hwaseong-si (KR); Bonghyun Choi, Yongin-si (KR); Siwan Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 218 days.

(21) Appl. No.: 17/011,156

(22) Filed: Sep. 3, 2020

(65) Prior Publication Data
US 2020/0402983 A1    Dec. 24, 2020

Related U.S. Application Data

(62) Division of application No. 16/403,795, filed on May 6, 2019, now Pat. No. 10,840,252.

(30) Foreign Application Priority Data

Aug. 28, 2018 (KR) .................. 10-2018-0101549

(51) Int. Cl.
H10B 43/20 (2023.01)
H10B 69/00 (2023.01)

(52) U.S. Cl.
CPC ............ H10B 69/00 (2023.02); *H10B 43/20* (2023.02)

(58) Field of Classification Search
CPC ............ H01L 27/115; H01L 27/11578; H01L 27/11548; H01L 27/11565; H01L 27/11575; H01L 27/11519; H01L 27/11582; H01L 27/11526; H01L 27/11556; H01L 27/11573; H01L 27/11551; H01L 27/11524; H01L 27/1157; H01L 27/1027; H01L 27/1028;
(Continued)

(56) References Cited

U.S. PATENT DOCUMENTS 8,004,015 B2   8/2011  Yoon
8,203,187 B2   6/2012  Lung et al.
(Continued)

FOREIGN PATENT DOCUMENTS

KR    20170085263 A    7/2017
KR    10-2018-0073045 A    7/2018
KR    10-2019-0057803 A    5/2019

*Primary Examiner* — Shahed Ahmed
*Assistant Examiner* — Khatib A Rahman
(74) *Attorney, Agent, or Firm* — Lee IP Law, P.C.

(57) ABSTRACT

A three-dimensional semiconductor memory device including a substrate including a cell array region and a first connection region arranged in a first direction; and a first block structure on the substrate, the first block structure including a lower stack including a plurality of lower electrodes vertically stacked on the substrate; and intermediate stacks exposing the lower stack, the intermediate stacks including a plurality of intermediate electrodes vertically stacked on the lower stack, wherein, on the cell array region, the first block structure has a first width in a second direction crossing the first direction, and wherein, on the first connection region, the first block structure has a second width, which is larger than the first width, in the second direction.

7 Claims, 32 Drawing Sheets

(58) Field of Classification Search
CPC ... H01L 27/11553; H10B 69/00; H10B 43/20;
H10B 41/50; H10B 43/10; H10B 43/50;
H10B 41/10; H10B 41/20; H10B 41/23;
H10B 41/27; H10B 41/40; H10B 43/40;
H10B 43/27; H10B 41/35; H10B 43/35
See application file for complete search history.

(56) References Cited

U.S. PATENT DOCUMENTS

| | | |
|---|---|---|
| 8,237,200 B2 | 8/2012 | Yoon |
| 8,325,527 B2 | 12/2012 | Jin et al. |
| 8,564,050 B2 | 10/2013 | Park et al. |
| 9,224,747 B2 | 12/2015 | Mizutani et al. |
| 10,236,211 B2 | 3/2019 | Yun et al. |
| 11,075,217 B2 | 7/2021 | Kim et al. |
| 2017/0141121 A1 | 5/2017 | Freeman et al. |
| 2017/0200676 A1* | 7/2017 | Jeong ............... H10B 41/35 |
| 2017/0207220 A1* | 7/2017 | Yun ............... H01L 29/7889 |
| 2017/0207221 A1 | 7/2017 | Kim et al. |
| 2017/0358595 A1 | 12/2017 | Freeman et al. |
| 2018/0182775 A1* | 6/2018 | Kim ............... H01L 27/1157 |
| 2018/0350836 A1 | 12/2018 | Freeman et al. |
| 2019/0139977 A1* | 5/2019 | Lee ............... H01L 27/11524 |
| 2019/0157283 A1 | 5/2019 | Jung et al. |
| 2019/0326218 A1 | 10/2019 | Chen |
| 2020/0091170 A1 | 3/2020 | Baek |
| 2020/0127006 A1 | 4/2020 | Otsu et al. |

* cited by examiner

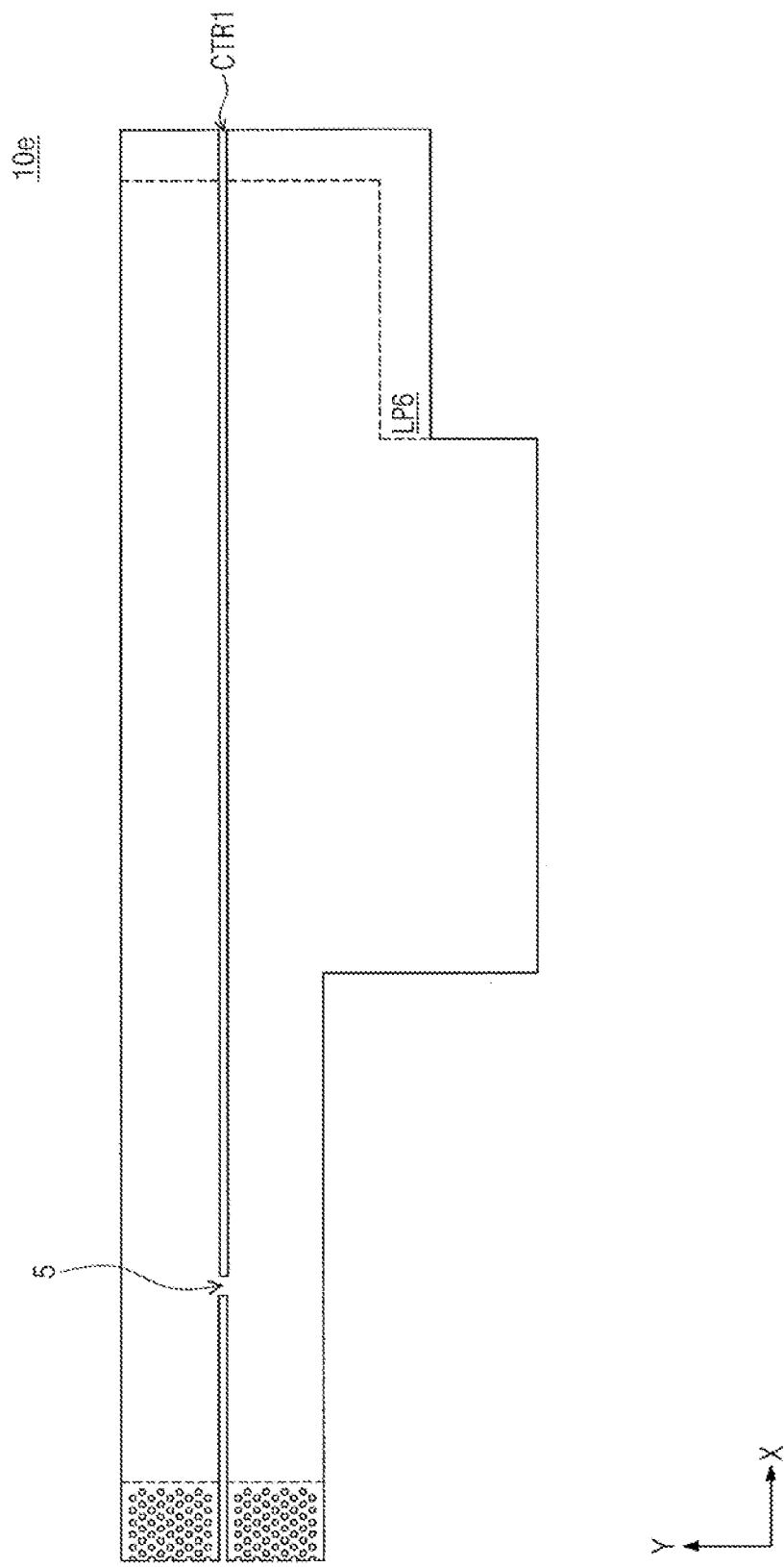

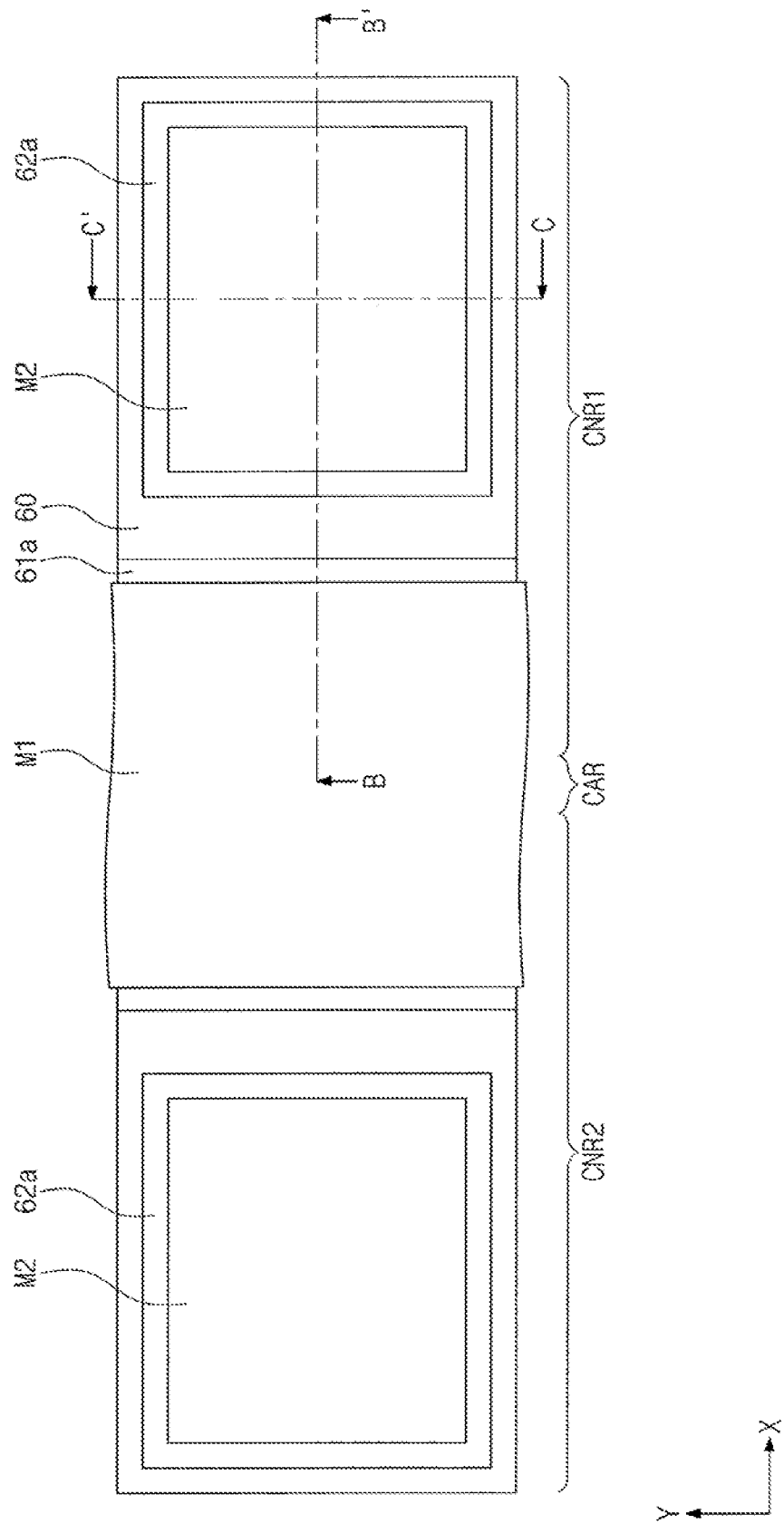

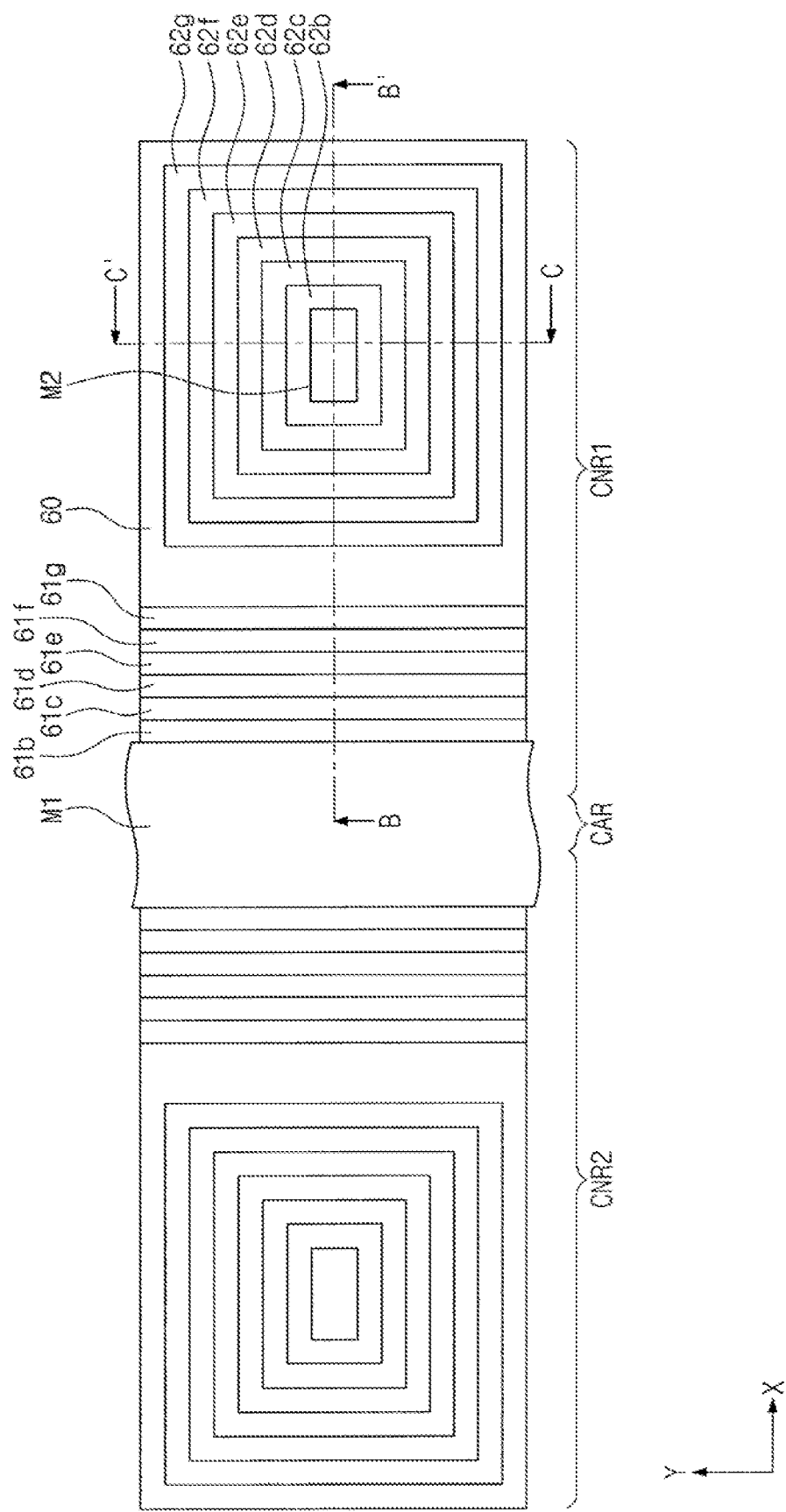

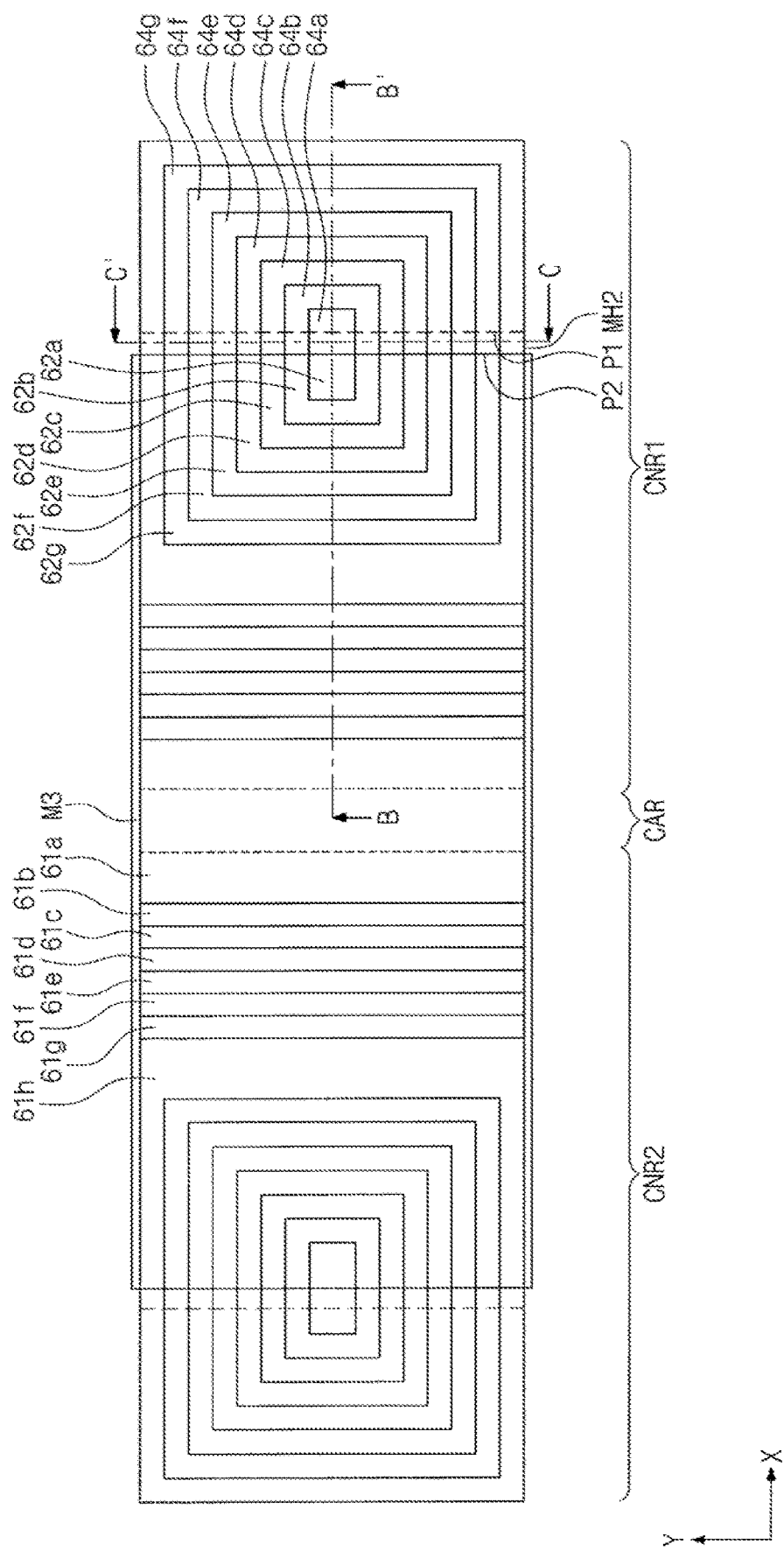

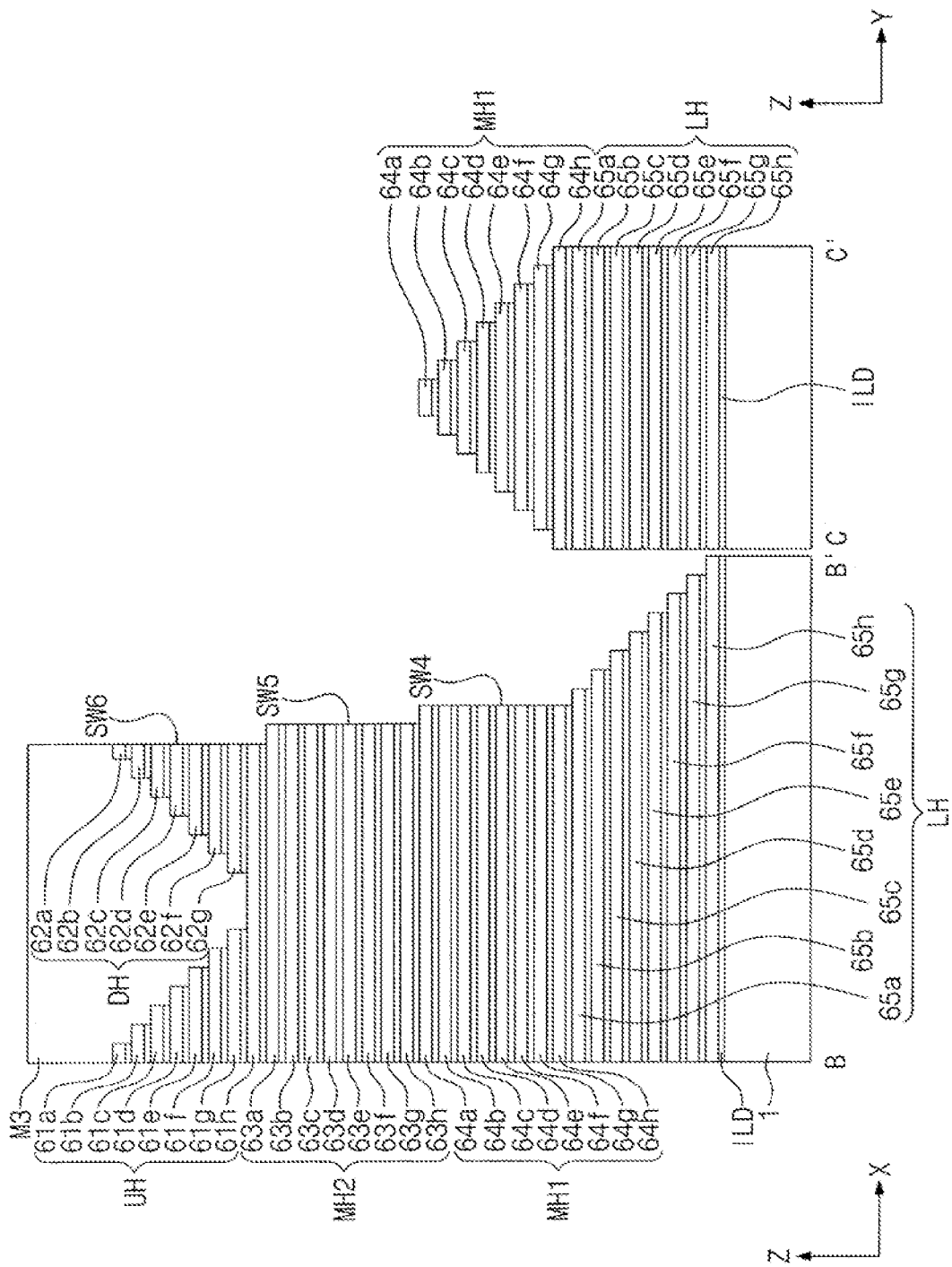

THREE-DIMENSIONAL SEMICONDUCTOR MEMORY DEVICE

CROSS-REFERENCE TO RELATED APPLICATIONS

This is a divisional application based on pending application Ser. No. 16/403,795, filed May 6, 2019, the entire contents of which is hereby incorporated by reference.

Korean Patent Application No. 10-2018-0101549, filed on Aug. 28, 2018, in the Korean Intellectual Property Office, and entitled: "Three-Dimensional Semiconductor Memory Device," is incorporated by reference herein in its entirety.

BACKGROUND

1. Field

Embodiments relate to a three-dimensional semiconductor device.

2. Description of the Related Art

Higher integration of semiconductor devices may be useful for satisfying consumer demands for superior performance and inexpensive prices. In the case of semiconductor devices, their integration may be an important factor in determining product prices, and increased integration may be desirable.

SUMMARY

The embodiments may be realized by providing a three-dimensional semiconductor memory device including a substrate including a cell array region and a first connection region arranged in a first direction; and a first block structure on the substrate, the first block structure including a lower stack including a plurality of lower electrodes vertically stacked on the substrate; and intermediate stacks exposing the lower stack, the intermediate stacks including a plurality of intermediate electrodes vertically stacked on the lower stack, wherein, on the cell array region, the first block structure has a first width in a second direction crossing the first direction, and wherein, on the first connection region, the first block structure has a second width, which is larger than the first width, in the second direction.

The embodiments may be realized by providing a three-dimensional semiconductor memory device including a substrate including a cell array region and a first connection region arranged in a first direction; and a first block structure on the substrate, the first block structure including a cell array portion on the cell array region; a first connecting portion on the first connection region and adjacent to the cell array portion in the first direction; and a second connecting portion on the first connection region and adjacent to the first connecting portion in a second direction crossing the first direction, wherein the second connecting portion is symmetric with respect to the first connecting portion and has a height difference from the first connecting portion.

The embodiments may be realized by providing a three-dimensional semiconductor memory device including a substrate including a cell array region and a connection region arranged in a first direction; and a block structure on the substrate, the block structure including a lower stack including a plurality of lower electrodes, which are vertically stacked on the substrate to form a staircase structure on the connection region; and an upper stack including a plurality of upper electrodes, which are at a same level on the lower stack and are spaced apart from each other in a second direction crossing the first direction, wherein a number of the lower electrodes is equal to or larger than a number of the upper electrodes.

BRIEF DESCRIPTION OF THE DRAWINGS

Features will be apparent to those of skill in the art by describing in detail exemplary embodiments with reference to the attached drawings in which:

FIGS. 8A to 8C illustrate plan views of some electrodes in the three-dimensional semiconductor memory device of FIG. 7.

FIGS. 11A to 16A illustrate plan views of stages in a process of fabricating the three-dimensional semiconductor memory device of FIG. 4.

FIGS. 11B to 16B illustrate sectional views taken along lines B-B' and C-C' of FIGS. 11A to 16A, respectively.

DETAILED DESCRIPTION

Figure 1:
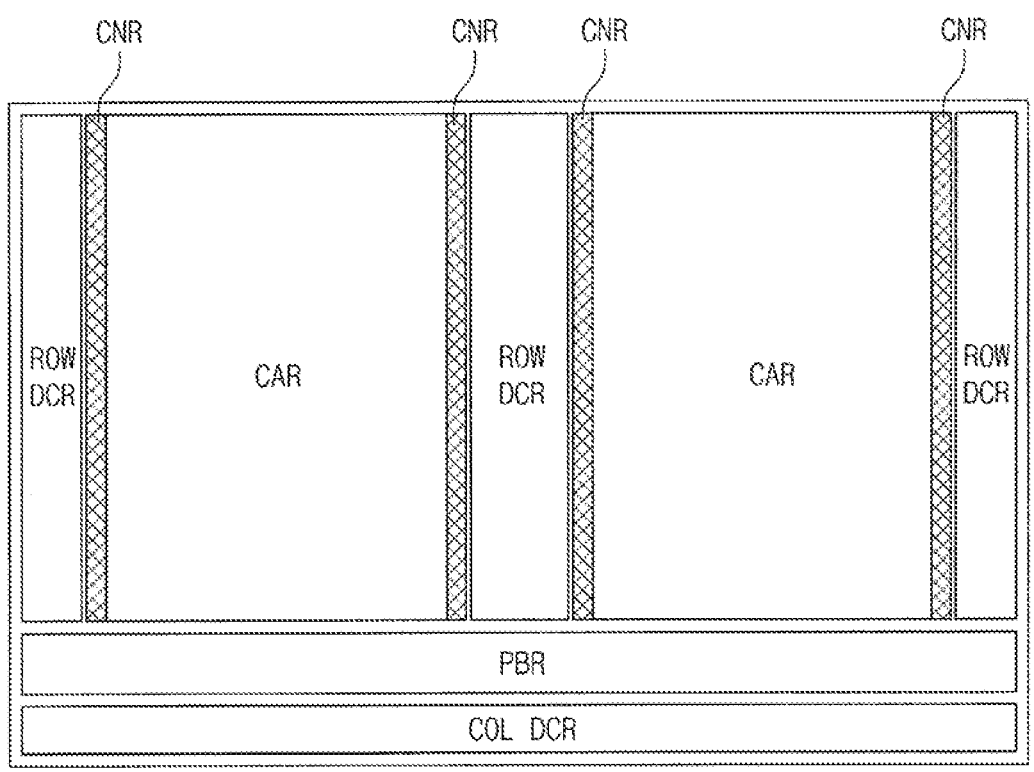
FIG. 1 illustrates a diagram schematically showing a three-dimensional semiconductor memory device according to example embodiments.

FIG. 1 illustrates a diagram schematically showing a three-dimensional semiconductor memory device according to example embodiments.

Referring to FIG. 1, a three-dimensional semiconductor memory device may include a cell array region CAR and a peripheral circuit region. The peripheral circuit region may include row decoder regions ROW DCR, a page buffer region PBR, a column decoder region COL DCR, and a control circuit region. In an implementation, a connection region CNR may be between the cell array region CAR and each of the row decoder regions ROW DCR.

A memory cell array including a plurality of memory cells may be in the cell array region CAR. In an implementation, the memory cell array may include the memory cells, which are three-dimensionally arranged, and a plurality of word lines and a plurality of bit lines, which are electrically connected to the memory cells.

In the row decoder region ROW DCR, a row decoder may select the word lines of the memory cell array, and in the connection region CNR, an interconnection structure including contact plugs and interconnection lines may electrically connect the memory cell array to the row decoder. The row decoder may be configured to select at least one of the word lines, based on address information. The row decoder may be configured to provide word line voltages to selected and unselected ones of the word lines in response to control signals from a control circuit.

In the page buffer region PBR, a page buffer may read out data stored in the memory cells. Depending on an operation mode, the page buffer may temporarily store data in the memory cells or to read out data stored in the memory cells. For example, the page buffer may function as a write driver in a program operation mode or as a sense amplifier in a read operation mode.

A column decoder connected to the bit lines of the memory cell array may be provided in the column decoder region COL DCR. The column decoder may provide data-transmission paths between the page buffer and an external device (e.g., a memory controller).

Figure 2:
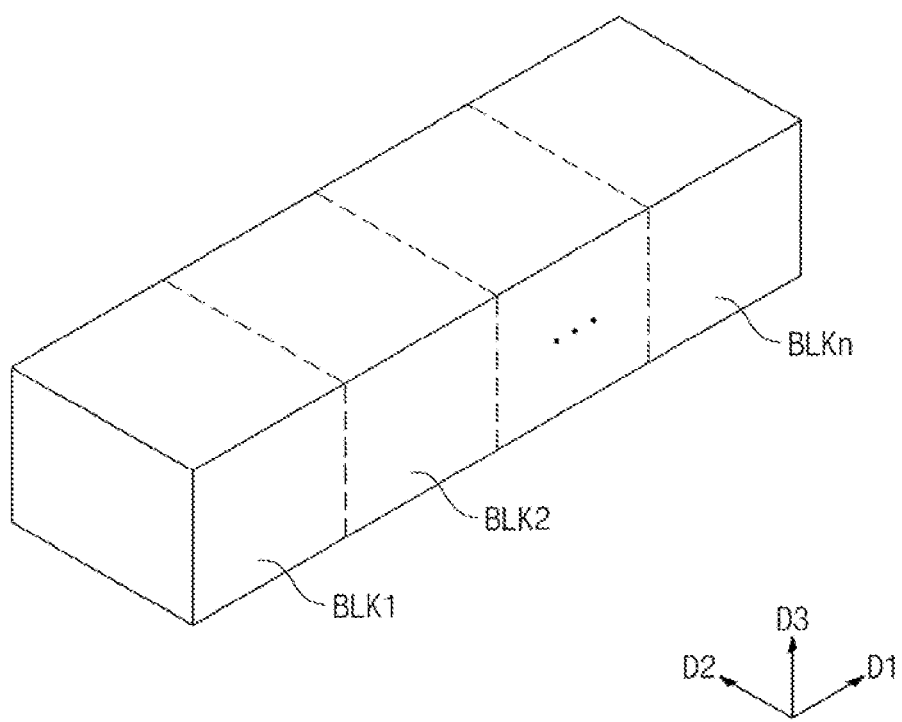
FIG. 2 illustrates a block diagram schematically showing a cell array of a three-dimensional semiconductor memory device according to example embodiments.

FIG. 2 illustrates a block diagram schematically showing a cell array of a three-dimensional semiconductor memory device according to example embodiments.

Referring to FIG. 2, the cell array region CAR may include a plurality of cell array blocks BLK1, BLK2, ..., and BLKn. Each of the cell array blocks BLK1, BLK2, ..., and BLKn may include an electrode structure including a plurality of electrodes, which are stacked in a third direction D3 on a plane defined by two different directions (e.g., first and second directions D1 and D2). The electrode structure may be coupled to a plurality of vertical structures (or semiconductor pillars) to constitute the memory cells that are three-dimensionally arranged. In addition, each of the cell array blocks BLK1, BLK2, ..., and BLKn may include bit lines that are electrically connected to the memory cells.

Figure 3:
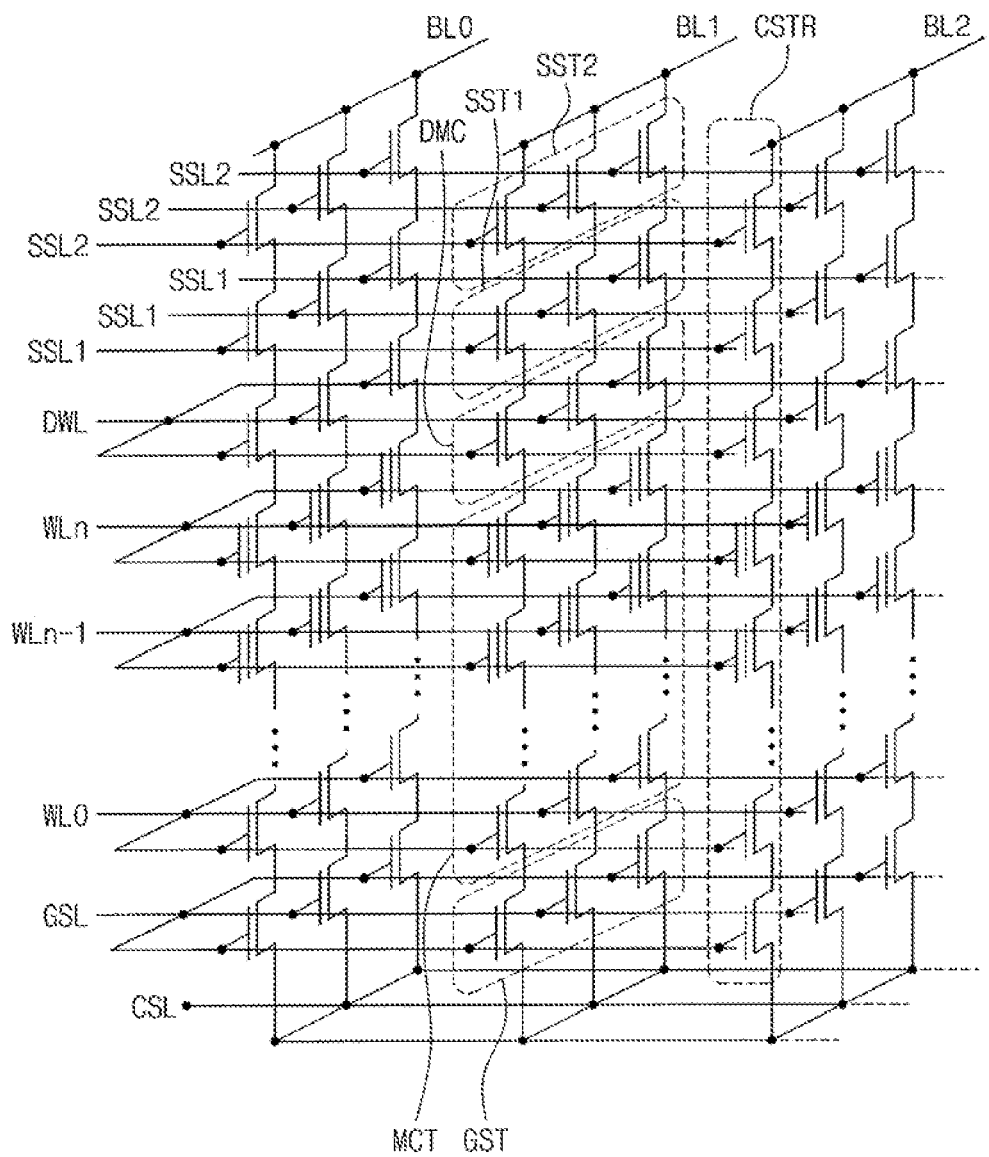
FIG. 3 illustrates a circuit diagram of a three-dimensional semiconductor memory device according to example embodiments.

FIG. 3 illustrates a circuit diagram of a three-dimensional semiconductor memory device according to example embodiments.

Referring to FIG. 3, the memory cell array of the three-dimensional semiconductor memory device may include a common source line CSL, a plurality of bit lines BL0-BL2, and a plurality of cell strings CSTR between the common source line CSL and the bit lines BL0-BL2.

The bit lines BL0-BL2 may be two-dimensionally arranged, and a plurality of the cell strings CSTR may be connected in parallel to each of the bit lines BL0-BL2. The cell strings CSTR may be connected in common to the common source line CSL. For example, a plurality of the cell strings CSTR may be between the bit lines BL0-BL2 and the single common source line CSL. In an implementation, a plurality of the common source lines CSL may be two-dimensionally arranged. The common source lines CSL may be applied with the same voltage or may be independently controlled.

In an implementation, each of the cell strings CSTR may include string selection transistors SST1 and SST2, which are connected in series, memory cell transistors MCT, which are connected in series, and a ground selection transistor GST. Each of the memory cell transistors MCT may include a data storage element.

For example, each of the cell strings CSTR may include first and second string selection transistors SST1 and SST2, which are connected in series, the second string selection transistors SST2 may be coupled to the bit lines BL0-BL2, and the ground selection transistor GST may be coupled to the common source line CSL. The memory cell transistors MCT may be connected in series to each other, between the first string selection transistor SST1 and the ground selection transistor GST.

In an implementation, each of the cell strings CSTR may further include a dummy cell DMC, which is between and connected to the first string selection transistor SST1 and the memory cell transistor MCT. In an implementation, the dummy cell DMC may be between and connected to the ground selection transistor GST and the memory cell transistor MCT.

In an implementation, in each of the cell strings CSTR, the ground selection transistor GST may include a plurality of metal-oxide-semiconductor (MOS) transistors, which are connected in series, similar to the first and second string selection transistors SST1 and SST2. In certain embodiments, each of the cell strings CSTR may be configured to include a single string selection transistor.

In an implementation, the first string selection transistor SST1 may be controlled by a first string selection line SSL1, and the second string selection transistor SST2 may be controlled by a second string selection line SSL2. The memory cell transistors MCT may be controlled by a plurality of word lines WL0-WLn, and the dummy cells DMC may be controlled by a dummy word line DWL. The ground selection transistor GST may be controlled by a ground selection line GSL. The common source line CSL may be connected in common to sources of the ground selection transistors GST.

Each of the cell strings CSTR may include a plurality of the memory cell transistors MCT located at different heights from the common source lines CSL. A plurality of the word lines WL0-WLn and DWL may be between the common source lines CSL and the bit lines BL0-BL2.

Gate electrodes of the memory cell transistors MCT, which are placed at substantially the same height from the common source lines CSL, may be connected in common to one of the word lines WL0-WLn and DWL, thereby being in an equipotential state. In an implementation, although the gate electrodes of the memory cell transistors MCT are placed at the substantially same height from the common source lines CSL, some of the gate electrodes may be placed in different rows or columns and may be independently controlled.

Figure 4:
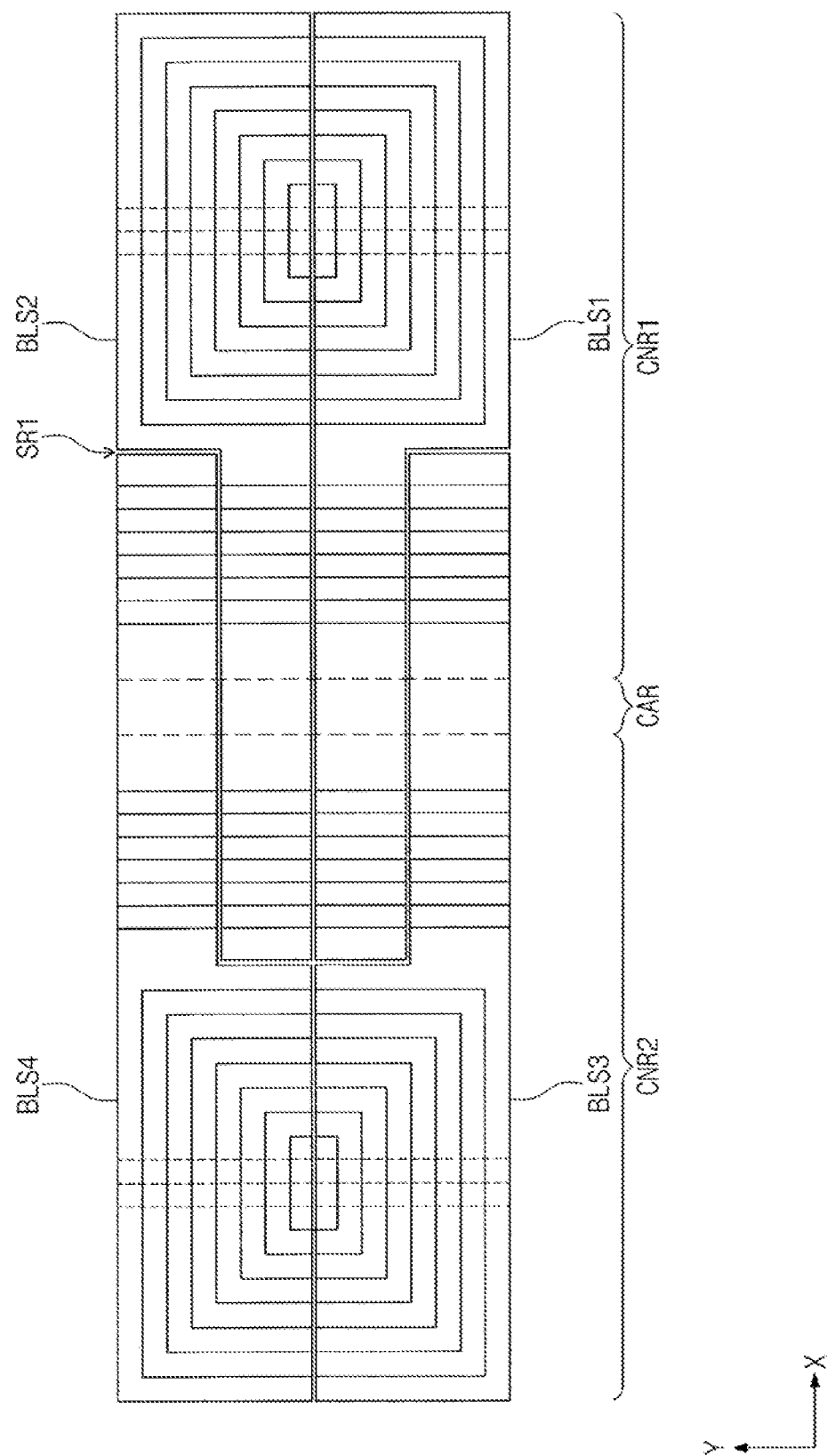
FIG. 4 illustrates a plan view of an electrode structure of a three-dimensional semiconductor memory device according to example embodiments.
Figure 5:
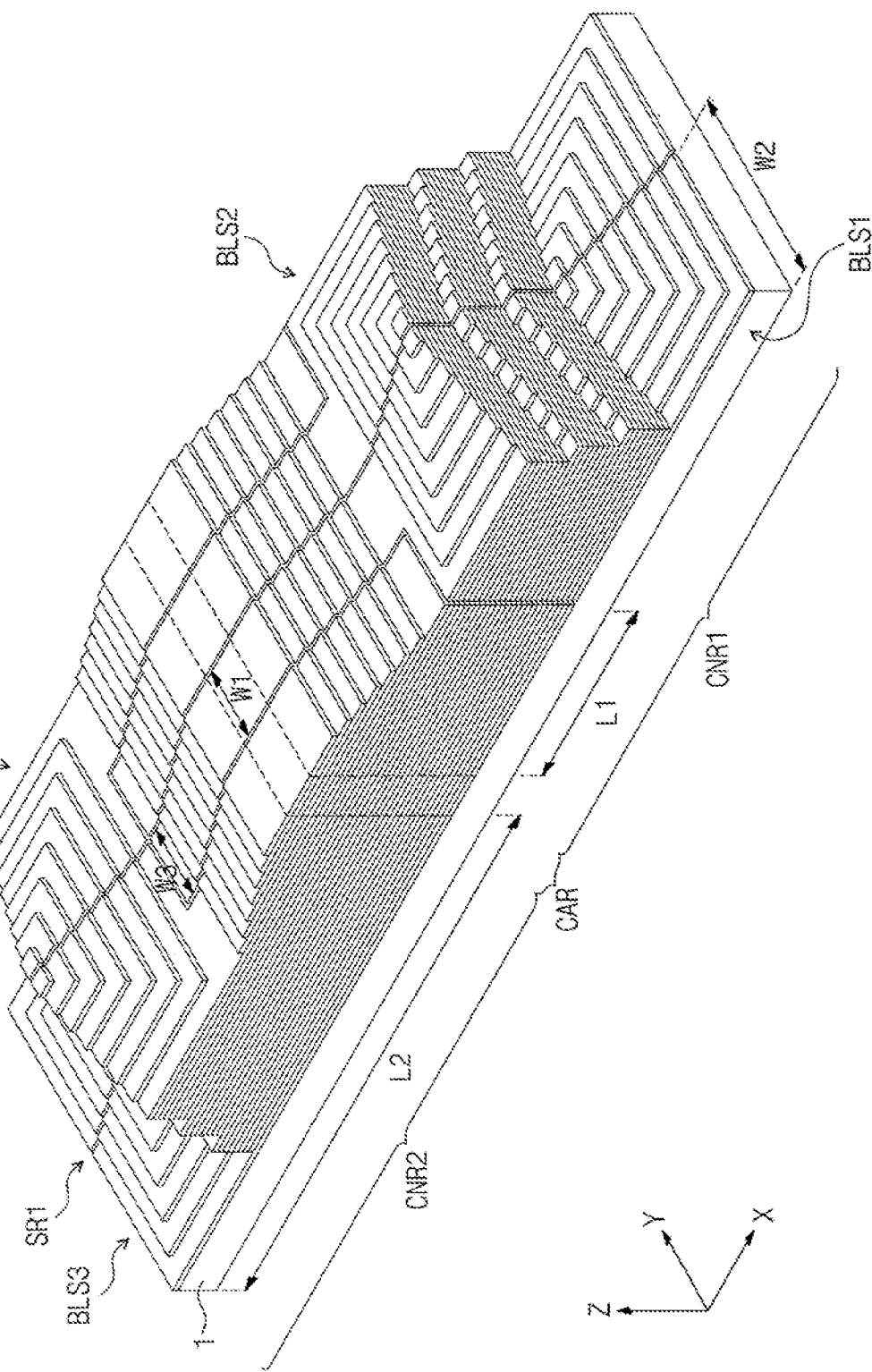
FIG. 5 illustrates a perspective view of an electrode structure of a three-dimensional semiconductor memory device according to example embodiments.

FIG. 4 illustrates a plan view of an electrode structure of a three-dimensional semiconductor memory device according to example embodiments. FIG. 5 illustrates a perspective view of an electrode structure of a three-dimensional semiconductor memory device according to example embodiments.

Referring to FIGS. 4 and 5, a substrate 1 may be provided. The substrate 1 may include a first connection region CNR1 and a second connection region CNR2, which are spaced apart from each other, and a cell array region CAR, which is between the first and second connection regions CNR1 and CNR2. First to fourth block structures BLS1, BLS2, BLS3, and BLS4, which are spaced apart from each other, may be on the substrate 1. Each of the first to fourth block structures BLS1, BLS2, BLS3, and BLS4 may have an 'L'-shaped planar structure. The first block structure BLS1 and the second block structure BLS2 may have a symmetric structure with respect to each other. The third block structure BLS3 and the fourth block structure BLS4 may have a symmetric structure with respect to each other. The first block structure BLS1 may have the same shape as the third block structure BLS3 rotated by an angle of 180°. The first block structure BLS1 and the third block structure BLS3 may be engaged to each other. Similarly, the second block structure BLS2 may have the same shape as the fourth block structure BLS4 rotated by an angle of 180°. The second block structure BLS2 and the fourth block structure BLS4 may be engaged to each other. A block separation region SR1 may be between the first to fourth block structures BLS1, BLS2, BLS3, and BLS4. In an implementation, the block separation region SR1 may have a zigzag shape, when viewed in a plan view.

The first to fourth block structures BLS1, BLS2, BLS3, and BLS4 may be elongated (e.g., may be longer) in a first direction X. The first connection region CNR1, the cell array region CAR, and the second connection region CNR2 may be arranged in the first direction X or in an opposite direction. A width of the first block structure BLS1 on the cell array region CAR may be a first width W1, when measured in a second direction Y crossing the first direction X. A width of the first block structure BLS1 in the second direction Y on the first connection region CNR1 may be a second width W2. A width of the first block structure BLS1 in the second direction Y on the second connection region CNR2 may be a third width W3. The second width W2 may be larger than the first width W1. The first width W1 may be substantially equal to the third width W3. The second block structure BLS2 may have the same width relationship as that of the first block structure BLS1. By contrast, a width of each of the third and fourth block structures BLS3 and BLS4 in the second direction Y may be larger on the second connection region CNR2 than on the first connection region CNR1.

A length of the third block structure BLS3 on the first connection region CNR1 may be a first length L1, when measured in the first direction X. A length of the third block structure BLS3 in the first direction X on the second connection region CNR2 may be a second length L2. The second length L2 may be larger than the first length L1. The fourth block structure BLS4 may have the same length relationship as that of the third block structure BLS3. By contrast, a length of each of the first and second block structures BLS1 and BLS2 in the first direction X may be larger on the first connection region CNR1 than on the second connection region CNR2.

When viewed in a plan view, the first block structure BLS1 may be bent in a direction opposite to the second direction Y on the first connection region CNR1 and may be adjacent to an end portion of the third block structure BLS3. The second block structure BLS2 may be bent in the second direction Y on the first connection region CNR1 and may be adjacent to an end portion of the fourth block structure BLS4. The second block structure BLS2 may be bent in the second direction Y on the second connection region CNR2 and may be adjacent to an end portion of the first block structure BLS1. The fourth block structure BLS4 may be bent in the direction opposite to the second direction Y on the second connection region CNR2 and may be adjacent to an end portion of the second block structure BLS2. Each of the first to fourth block structures BLS1, BLS2, BLS3, and BLS4 may have a staircase structure on the first and second connection regions CNR1 and CNR2. This will be described in more detail below.

Figure 6:
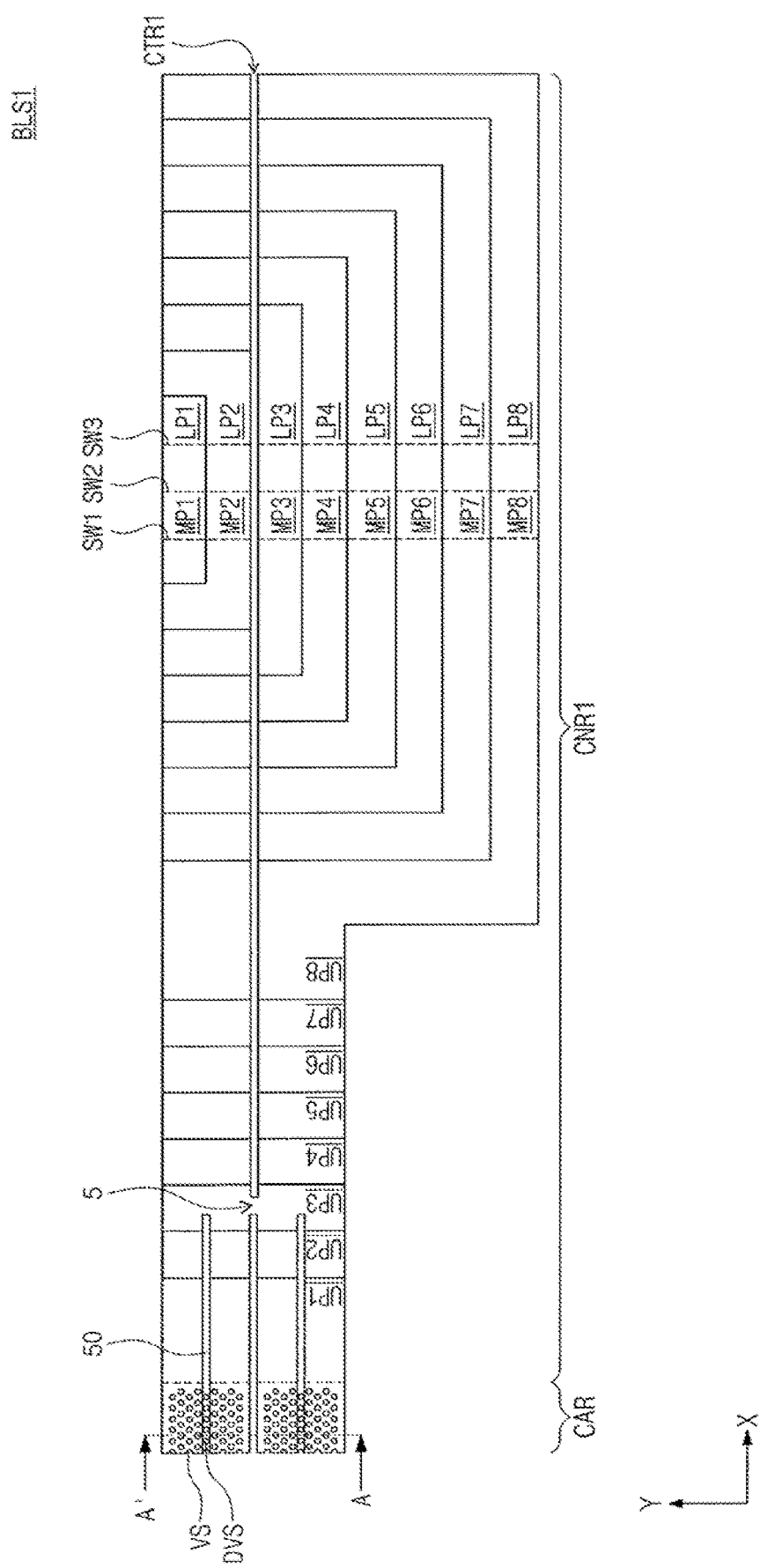
FIG. 6 illustrates a plan view of a portion of a first block structure in the three-dimensional semiconductor memory device of FIG. 4.
Figure 7:
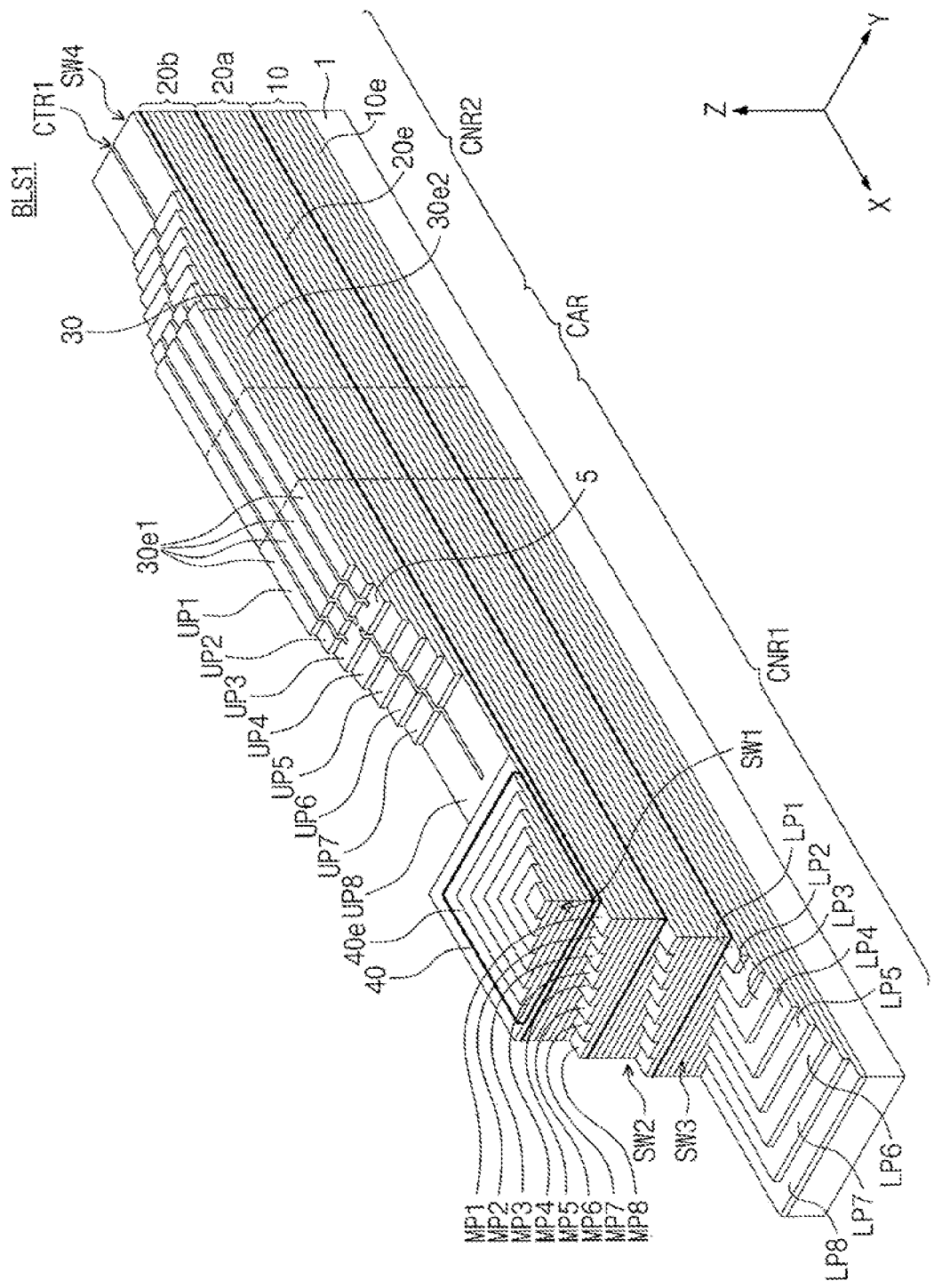
FIG. 7 illustrates a perspective view of a first block structure in the three-dimensional semiconductor memory device of FIG. 5.
Figure 8A:
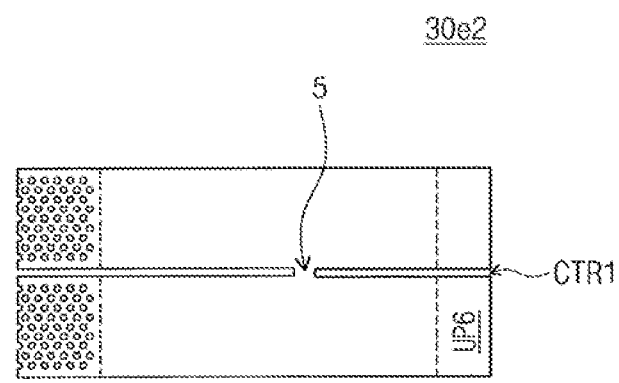
Figure 8B:
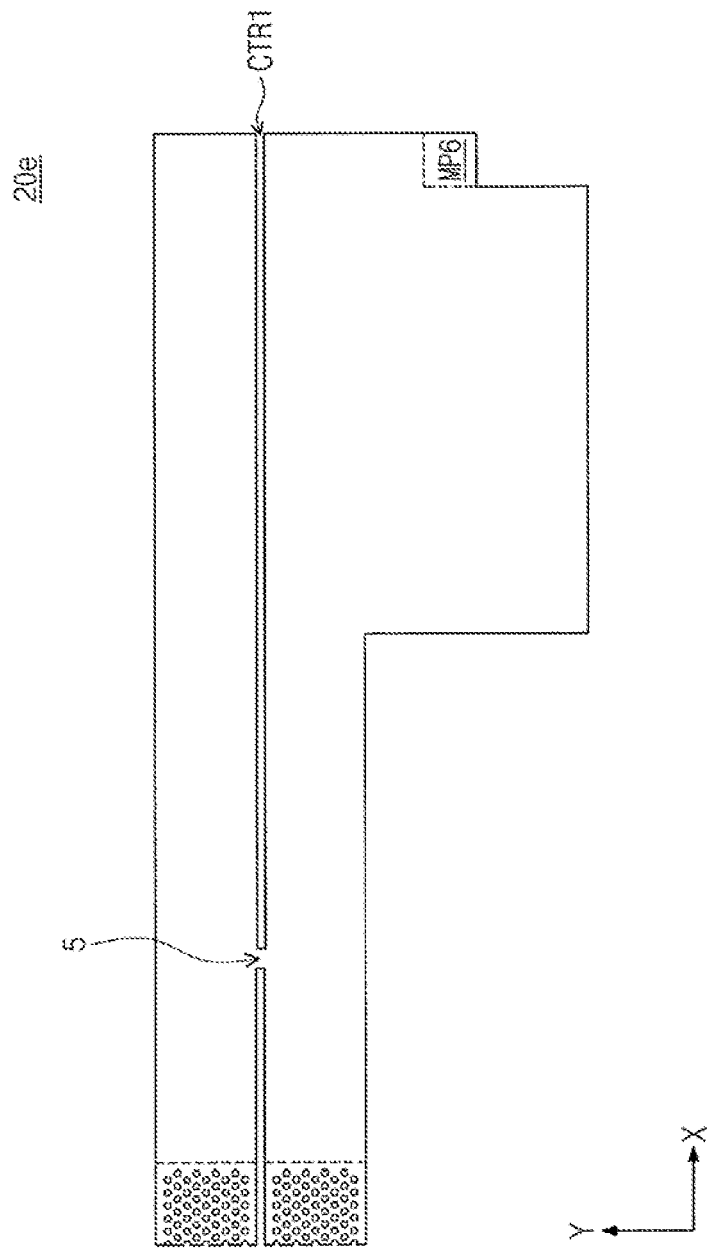

FIG. 6 illustrates a plan view of a portion of a first block structure in the three-dimensional semiconductor memory device of FIG. 4. FIG. 7 illustrates a perspective view of a first block structure in the three-dimensional semiconductor memory device of FIG. 5. FIGS. 8A to 8C illustrate plan views of some electrodes in the three-dimensional semiconductor memory device of FIG. 7.

Referring to FIGS. 6, 7, and 8A to 8C, the first block structure BLS1 may include a lower stack 10, first and second intermediate stacks 20a and 20b, and an upper stack 30, which are sequentially stacked on the substrate 1. The lower stack 10 may include a plurality of lower electrodes 10e, which are vertically stacked on the substrate 1. The lower electrodes 10e may form a staircase structure in both of the first and second directions X and Y, on the first connection region CNR1. The lower electrodes 10e may have first to eighth lower pad regions LP1-LP8. The first to eighth lower pad regions LP1-LP8 may form a downward staircase structure in the first direction X and a direction opposite to the second direction Y. The first to eighth lower pad regions LP1-LP8 may form a staircase structure whose thickness is decreased in the first direction X and in a direction opposite to the second direction Y. Areas of the first to eighth lower pad regions LP1-LP8 may decrease with increasing vertical distance from the substrate 1. For example, the eighth lower pad region LP8, which is the lowermost pad of the first to eighth lower pad regions LP1-LP8, may have a largest area, and the first lower pad region LP1, which is the uppermost pad, may have a smallest area. Each of the second to eighth lower pad regions LP2-LP8 may have an 'L'-shaped planar structure. In an implementation, insulating layers ILD (e.g., see FIG. 10) may be between the lower stack 10 and the substrate 1 and between the lower electrodes 10e to vertically separate them from each other.

The first and second intermediate stacks 20a and 20b may be offset with respect to each other in the first direction X. Each of the first and second intermediate stacks 20a and 20b may include a plurality of intermediate electrodes 20e, which are vertically stacked on the substrate 1. The intermediate electrodes 20e may form a staircase structure in the second direction Y, on the first connection region CNR1. The intermediate electrodes 20e may have first to eighth intermediate pad regions MP1-MP8. The first to eighth intermediate pad regions MP1-MP8 may form a downward staircase structure in the direction opposite to the second direction Y. The first to eighth intermediate pad regions MP1-MP8 may form a staircase structure whose thickness is decreased in the direction opposite to the second direction Y. In an implementation, the insulating layers ILD (e.g., see FIG. 10) may be between the lower stack 10 and the first and second intermediate stacks 20a and 20b and between the intermediate electrodes 20e to vertically separate them from each other.

The upper stack 30 may include second upper electrodes 30e2 and first upper electrodes 30e1, which are vertically stacked. When viewed in a plan view, the first upper electrodes 30e1 may be line-shaped patterns spaced apart from each other in the second direction Y. On the first and second connection regions CNR1 and CNR2, end portions of the first upper electrodes 30e1 may form a staircase structure in the first direction X and may be spaced apart from each other. For example, the first upper electrodes 30e1 may include first and second upper pad regions UP1 and UP2 on the first connection region CNR1. End portions of the second upper electrodes 30e2 may form a staircase structure in the first direction X, on the first and second connection regions CNR1 and CNR2. The second upper electrodes 30e2 may include third to eighth upper pad regions UP3-UP8 on the first connection region CNR1. The first to eighth upper pad regions UP1-UP8 may be form a downward staircase structure in the first direction X. The first to eighth upper pad regions UP1-UP8 may form a staircase structure having a decreasing thickness in the first direction X. The lowermost pad region (e.g., the eighth upper pad region UP8) may have an area that is larger than that of each of the first to seventh upper pad regions UP1-UP7. In an implementation, the insulating layers ILD (e.g., see FIG. 10) may be between the second intermediate stack 20b and the upper stack 30 and between the first and second upper electrodes 30e1 and 30e2 to vertically separate them from each other.

A width of the second to seventh upper pad regions UP2-UP7 in the first direction X may be the same as that of the first to eighth lower pad regions LP1-LP8. A width of the first to eighth intermediate pad regions MP1-MP8 in the second direction Y may be the same as that of the first to eighth lower pad regions LP1-LP8.

On the first connection region CNR1, a dummy stack 40 may be on the eighth upper pad region UP8. The dummy stack 40 may include dummy electrodes 40e, which are vertically stacked on the substrate 1. The dummy electrodes 40e may form a staircase structure in the first and second directions X and Y. In an implementation, insulating layers may be between the eighth upper pad region UP8 and the dummy stack 40 and between the dummy electrodes 40e to vertically separate them from each other. The dummy electrodes 40e may not be applied with any voltage and may be in a floating state.

The dummy electrodes 40e constituting the dummy stack 40 may have first sidewalls SW1, which are exposed in the first direction X on the first connection region CNR1 and are vertically aligned to each other. The intermediate electrodes 20e constituting the second intermediate stack 20b may have second sidewalls SW2, which are exposed in the first direction X on the first connection region CNR1 and are vertically aligned to each other. The intermediate electrodes 20e constituting the first intermediate stack 20a may have third sidewalls SW3, which are exposed in the first direction X on the first connection region CNR1 and are vertically aligned to each other.

The lower stack 10, the first and second intermediate stacks 20a and 20b, and the upper stack 30 may have fourth sidewalls SW4, which are exposed in a direction opposite to the first direction X on the second connection region CNR2 and are vertically aligned to each other.

Each of the lower stack 10, the first and second intermediate stacks 20a and 20b, and the upper stack 30 may include a first cut region CTR1, which penetrates them and extend in the first direction X. The first cut region CTR1 may be formed in the cell array region CAR and the first and second connection regions CNR1 and CNR2. On the first connection region CNR1, the first cut region CTR1 may be extended to an edge of the first block structure BLS1. On the first and second connection regions CNR1 and CNR2, each of the second upper electrodes 30e2, the intermediate electrodes 20e, and the lower electrodes 10e may have an electrode connecting portion 5, which prevents the electrodes 30e2, 20e and 10e from being divided into two parts by the first cut region CTR1. Thus, the second upper electrodes 30e2, the intermediate electrodes 20e, and the lower electrodes 10e at the same level may be in an equipotential state.

In an implementation, contact plugs may be on the pad regions to apply voltages to the pad regions, respectively. In an implementation, the shape of the block structure on the connection region may be changed to increase areas of the pad regions, and thus, it may be possible to help prevent a bridge issue between contact plugs and to increase a degree of freedom in constructing a routing structure.

In an implementation, dummy vertical channels may penetrate the pad regions, and it may be possible to help prevent the block structures from leaning or falling during a subsequent fabrication process. In an implementation, the shape of the block structure on the connection region may be changed to increase the areas of the pad regions, and it may be possible to dispose the dummy vertical channels more easily. Thus, it may be possible to provide a three-dimensional semiconductor memory device with improved reliability.

In an implementation, the number of the first upper electrodes 30e1 located at the highest level may be less than the number of the upper pad regions UP1-UP8. The number of the first upper electrodes 30e1 at the highest level may be less than the number of the intermediate pad regions MP1-MP8. The number of the first upper electrodes 30e1 at the highest level may be less than the number of the lower pad regions LP1-LP8. In an implementation, the number of the first upper electrodes 30e1 at the highest level may be four, and the numbers of the intermediate pad regions MP1-MP8 and the lower pad regions LP1-LP8 may be eight. The number of the first upper electrodes 30e1 at the highest level may correspond to the number of the string selection lines at the highest level. The number of the intermediate pad regions MP1-MP8 in each of the first and second intermediate stacks 20a and 20b or the number of the lower pad regions LP1-LP8 in the lower stack 10 may correspond to the number of stair dividing patterns (SDP).

In an implementation, the shapes of the block structures BLS1-BLS4 on the connection regions CNR1 and CNR2 may be variously changed. For example, end portions of the block structures BLS1-BLS4 on the connection regions CNR1 and CNR2 may have a width larger than a width on the cell array region CAR. For example, it may be possible to secure an area for the stair dividing patterns, regardless of the number of the string selection lines. Furthermore, it may be possible to reduce lengths of the block structures BLS1-BLS4 in the first direction X. In addition, the block structures BLS1-BLS4 may have an interlocking structure, when viewed in a plan view, and this may make it possible to increase an integration density of a three-dimensional semiconductor memory device.

The above description referred to an example in which eight stair dividing patterns are provided. In an implementation, the number of the stair dividing patterns may be larger than or equal to four.

Figure 9:
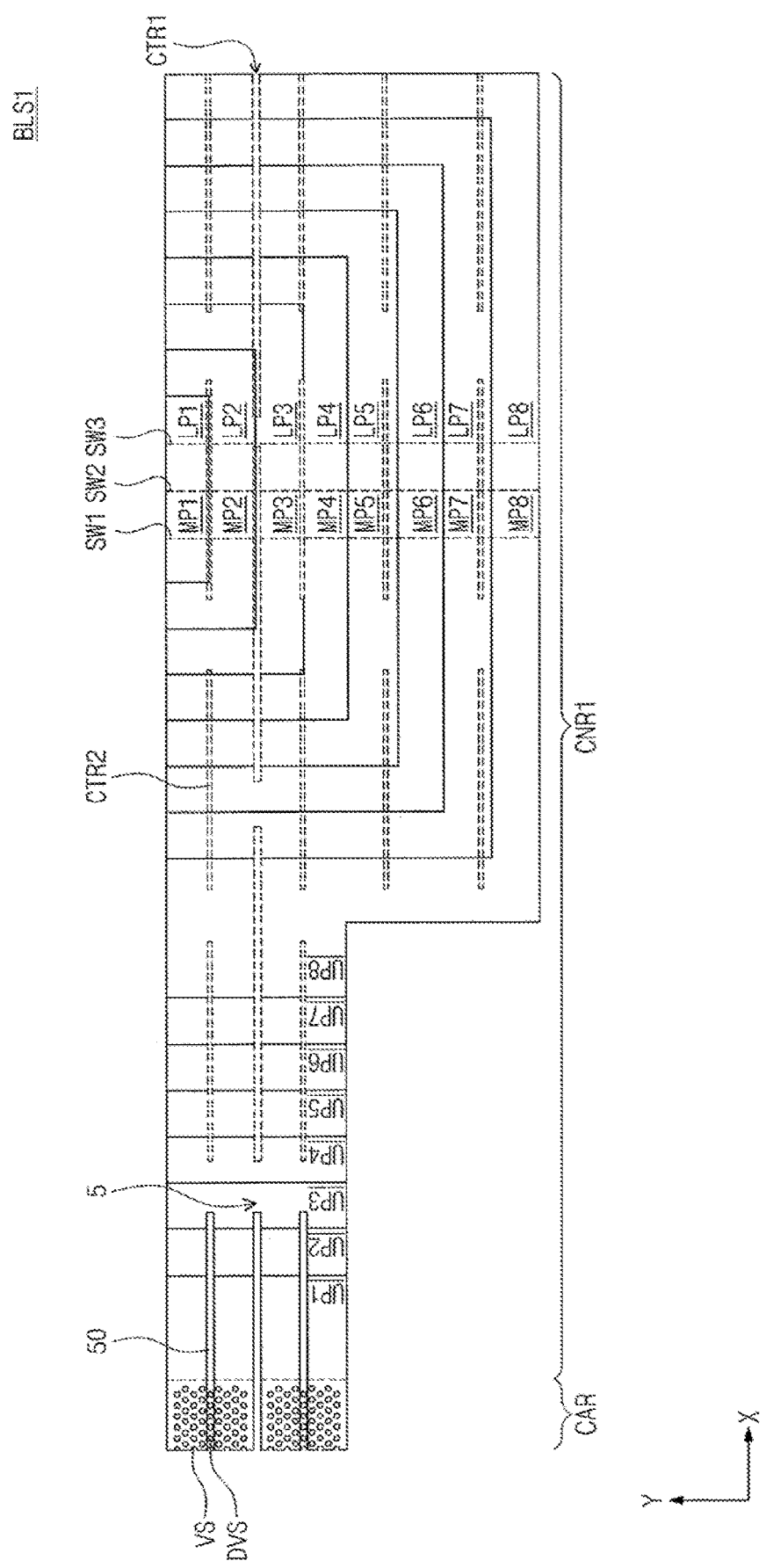
FIG. 9 illustrates a plan view of a portion of a first block structure in a three-dimensional semiconductor memory device according to example embodiments.

FIG. 9 illustrates a plan view of a portion of a first block structure in a three-dimensional semiconductor memory device according to example embodiments.

Referring to FIGS. 7 and 9, the disposition of the first cut regions CTR1 in the first block structure BLS1 may be variously changed. In addition, the first block structure BLS1 may include dummy cut regions CTR2, which may be variously disposed. The first cut regions CTR1 and the dummy cut regions CTR2 may vertically penetrate the lower stack 10, the intermediate stacks 20a and 20b, the upper stack 30, and the dummy stack 40.

Figure 10:
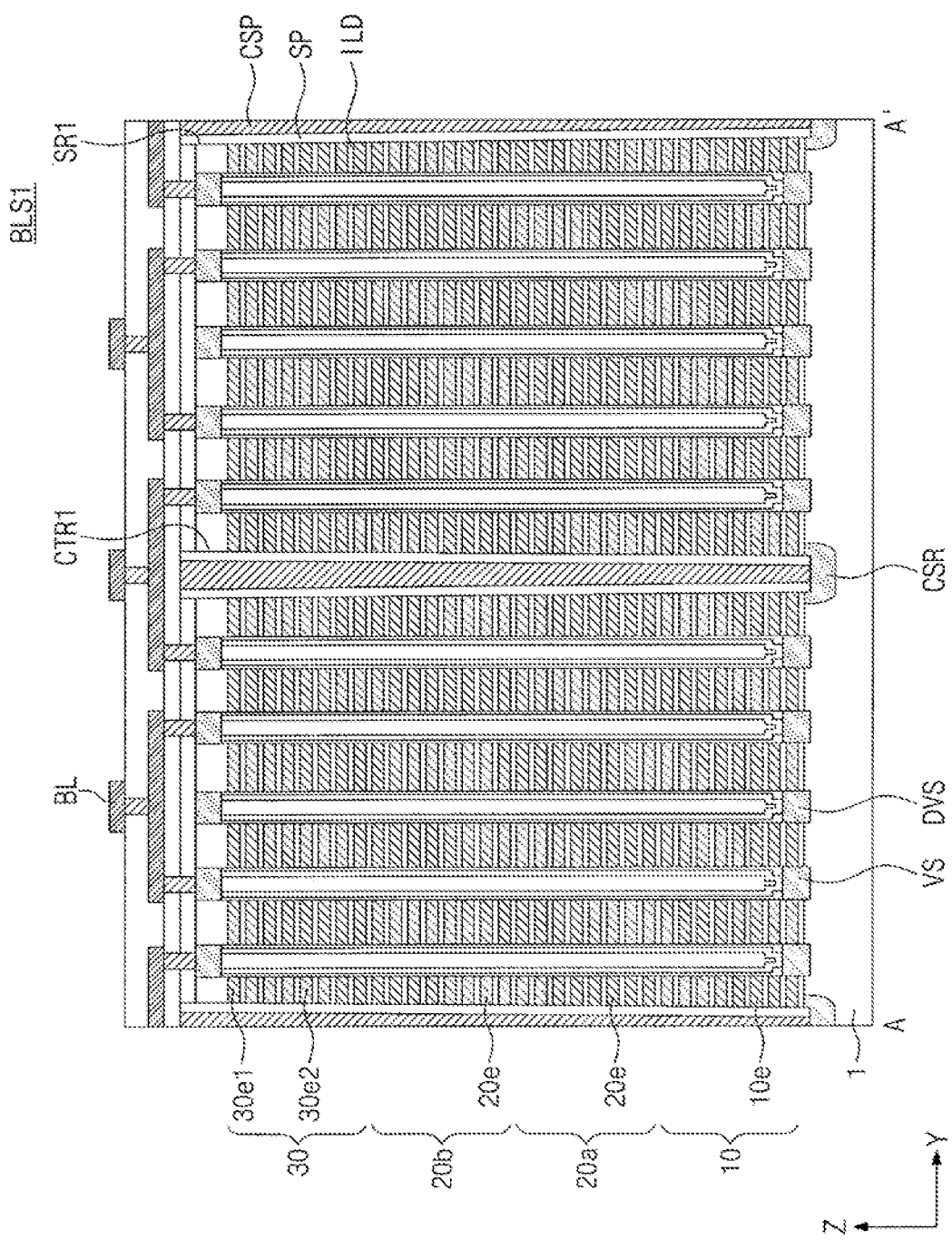
FIG. 10 illustrates a sectional view taken along line A-A' of FIG. 6

FIG. 10 illustrates a sectional view taken along line A-A' of FIG. 6.

Referring to FIGS. 6, 7, and 10, a plurality of vertical channels VS and a plurality of dummy vertical channel DVS, which have an elongated shape in a third direction Z, may be provided on the cell array region CAR of the substrate 1. The vertical channels VS and the dummy vertical channel DVS may penetrate the lower stack 10, the first and second intermediate stack 20a and 20b, and the upper stack 30 described above. The vertical channels VS may form a zigzag arrangement, when viewed in a plan view. The dummy vertical channels DVS may be provided between an adjacent pair of the first upper electrodes 30e1. A separation insulating pattern 50 may be provided between an adjacent pair of the first upper electrodes 30e1 and between the dummy vertical channels DVS.

The vertical channels VS and the dummy vertical channels DVS may be formed of substantially the same material and may have substantially the same structure. For example, the vertical channels VS and the dummy vertical channels DVS may have a hollow pipe shape or a macaroni shape. In an implementation, the vertical channels VS and the dummy vertical channels DVS may have a circular pillar shape. The vertical channels VS may be electrically connected to a bit line BL. By contrast, the dummy vertical channels DVS may not be connected to the bit line BL and may be in an electrical floating state.

Common source regions CSR may be in respective regions of the substrate 1 between the electrodes, when viewed in a plan view. The common source regions CSR may be formed by doping the substrate 1 with impurities of a second conductivity type. A common source plug CSP may be connected to the common source region CSR, and a sidewall insulating spacer SP may be between the common source plug CSP and the stacks 10, 20a, 20b, and 30. The common source plug CSP may be in the block separation region SR1 of FIG. 5 and in the first cut region CTR1 of FIG. 7. In addition, the common source plug CSP may also be in the dummy cut region CTR2 of FIG. 9.

FIGS. 11A to 16A illustrate plan views of stages in a process of fabricating the three-dimensional semiconductor memory device of FIG. 4. FIGS. 11B to 16B illustrate sectional views taken along lines B-B' and C-C' of FIGS. 11A to 16A, respectively.

Figure 11A:
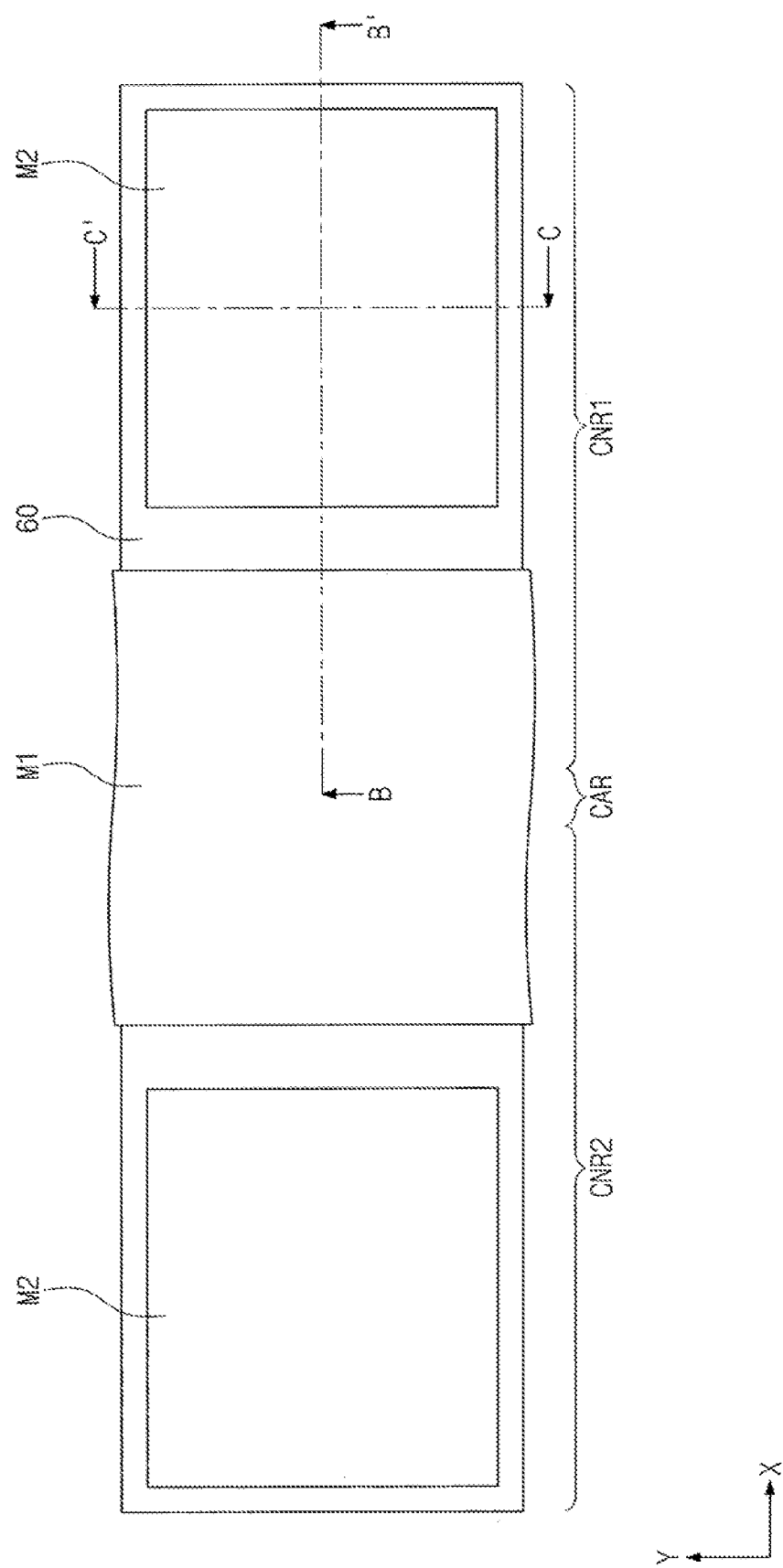
Figure 11B:
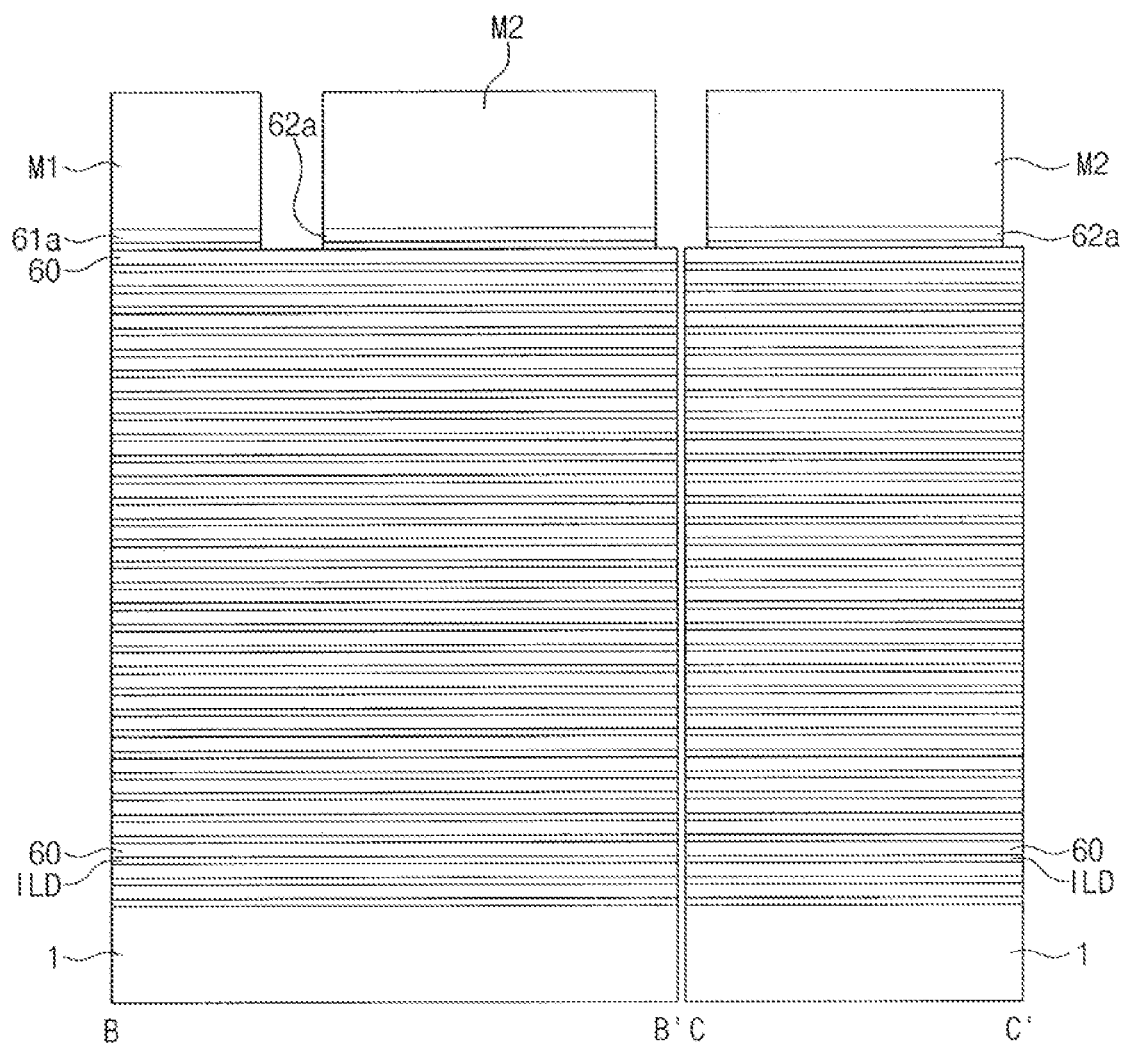
Figure 12B:
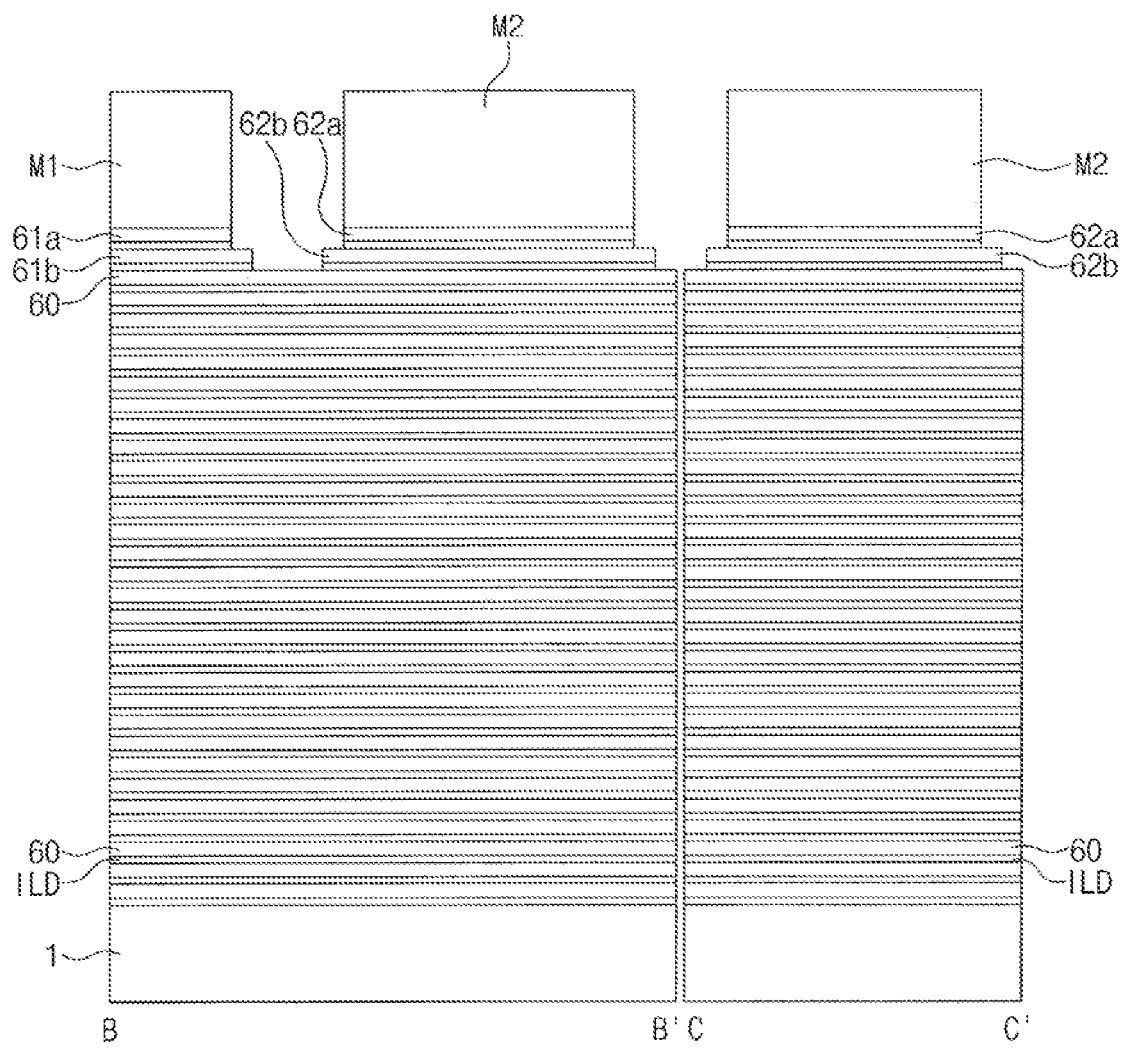

Referring to FIGS. 11A and 11B, insulating layers ILD and horizontal layers 60 may be alternately stacked on the substrate 1 (including the first and second connection regions CNR1 and CNR2 and the cell array region CAR therebetween). The horizontal layers 60 may be formed of a material having an etch selectivity with respect to the insulating layers ILD. For example, the insulating layers ILD may be formed of or include silicon oxide, and the horizontal layers 60 may be formed of or include at least one of silicon nitride, silicon oxynitride, poly silicon, or a metal. The horizontal layers 60 may have the same thickness. The insulating layers ILD may have the same thickness. A pair of the insulating layer ILD and the horizontal layer 60 adjacent to each other may constitute a single etch-target layer.

A first mask pattern M1 and second mask patterns M2 may be formed on the uppermost layer of the horizontal layers 60. The first mask pattern M1 may cover the cell array region CAR and the first and second connection regions CNR1 and CNR2 adjacent thereto. The second mask patterns M2 may be formed on the first and second connection regions CNR1 and CNR2, respectively, and may be spaced apart from the first mask pattern M1. The first mask pattern M1 and the second mask patterns M2 may be, e.g., photoresist patterns. By using the first mask pattern M1 and the second mask patterns M2 as an etch mask, the etch-target layer including one horizontal layer 60 and one insulating layer ILD may be etched to form a (1a)-th horizontal pattern 61a and (2a)-th horizontal patterns 62a and to expose a top surface of the horizontal layer 60 under the etch-target layer.

Referring to FIGS. 11A, 11B, 12A, and 12B, a first trimming process may be performed to reduce planar areas of the first mask pattern M1 and the second mask patterns M2. The first trimming process may be performed using, e.g., an isotropic dry etching process or a wet etching process. During the first trimming process, the first mask pattern M1 and the second mask patterns M2 may be etched, and areas, widths, and thicknesses of the first mask pattern M1 and the second mask patterns M2 may be reduced. Thus, edge regions of top surfaces of the (1a)-th horizontal pattern 61a and the (2a)-th horizontal patterns 62a may be exposed. The exposed edge regions of the (1a)-th horizontal pattern 61a and the (2a)-th horizontal patterns 62a and another pair of the horizontal layer 60 and the insulating layer ILD exposed therebetween may be etched to reduce widths of the (1a)-th horizontal pattern 61a and the (2a)-th horizontal patterns 62a and to form a (1b)-th horizontal pattern 61b and (2b)-th horizontal patterns 62b thereunder, and here, the first mask pattern M1 and the second mask patterns M2, which are shrunk by the first trimming process, may be used as an etch mask in this etching process. Furthermore, a top surface of the horizontal layer 60 under the (1b)-th horizontal pattern 61b and the (2b)-th horizontal patterns 62b may be exposed by this etching process.

Figure 13B:
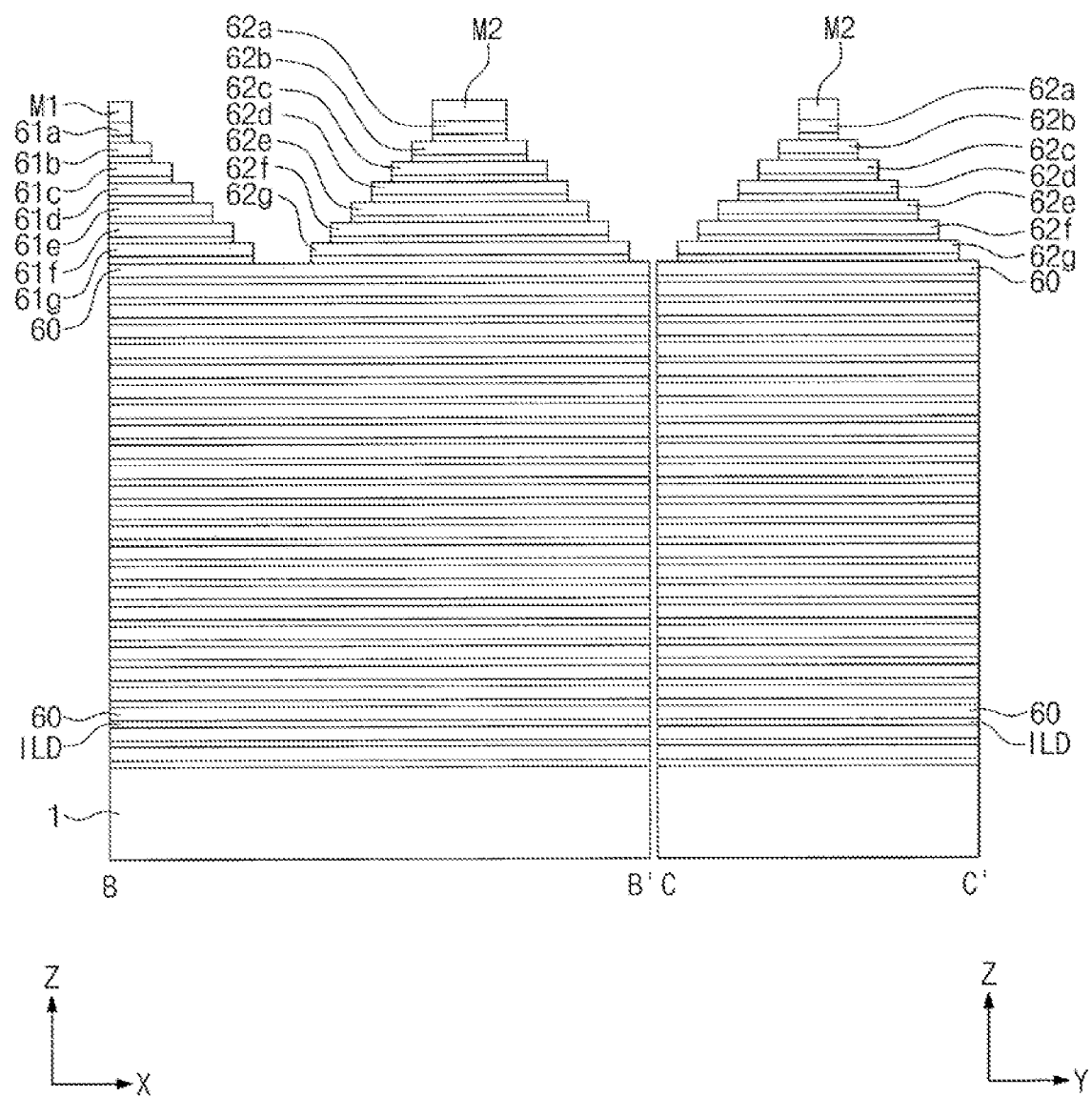

Referring to FIGS. 13A and 13B, the first trimming process and the etching process may be repeated several times to form (1a)-th to (1g)-th horizontal patterns 61a-61g and (2a)-th to (2g)-th horizontal patterns 62a-62g forming a staircase structure. Furthermore, a top surface of the horizontal layer 60 thereunder may be exposed by this process. When the first trimming processes are finished, the first mask pattern M1 and the second mask patterns M2 may become relatively very small. The (2a)-th to (2g)-th horizontal patterns 62a-62g may be patterned to form a pyramid structure spaced apart from the cell array region CAR. The first trimming processes may be performed to reduce widths, in both of the first and second directions X and Y, of the second mask patterns M2 and a width, in the first direction X, of the first mask pattern M1, in a stepwise manner. In an implementation, the first trimming process and the etching process may be repeated at least seven times to form a staircase structure having at least eight steps. The number of the stair dividing patterns may be determined by the repetition number of the first trimming process and the etching process.

Figure 14A:
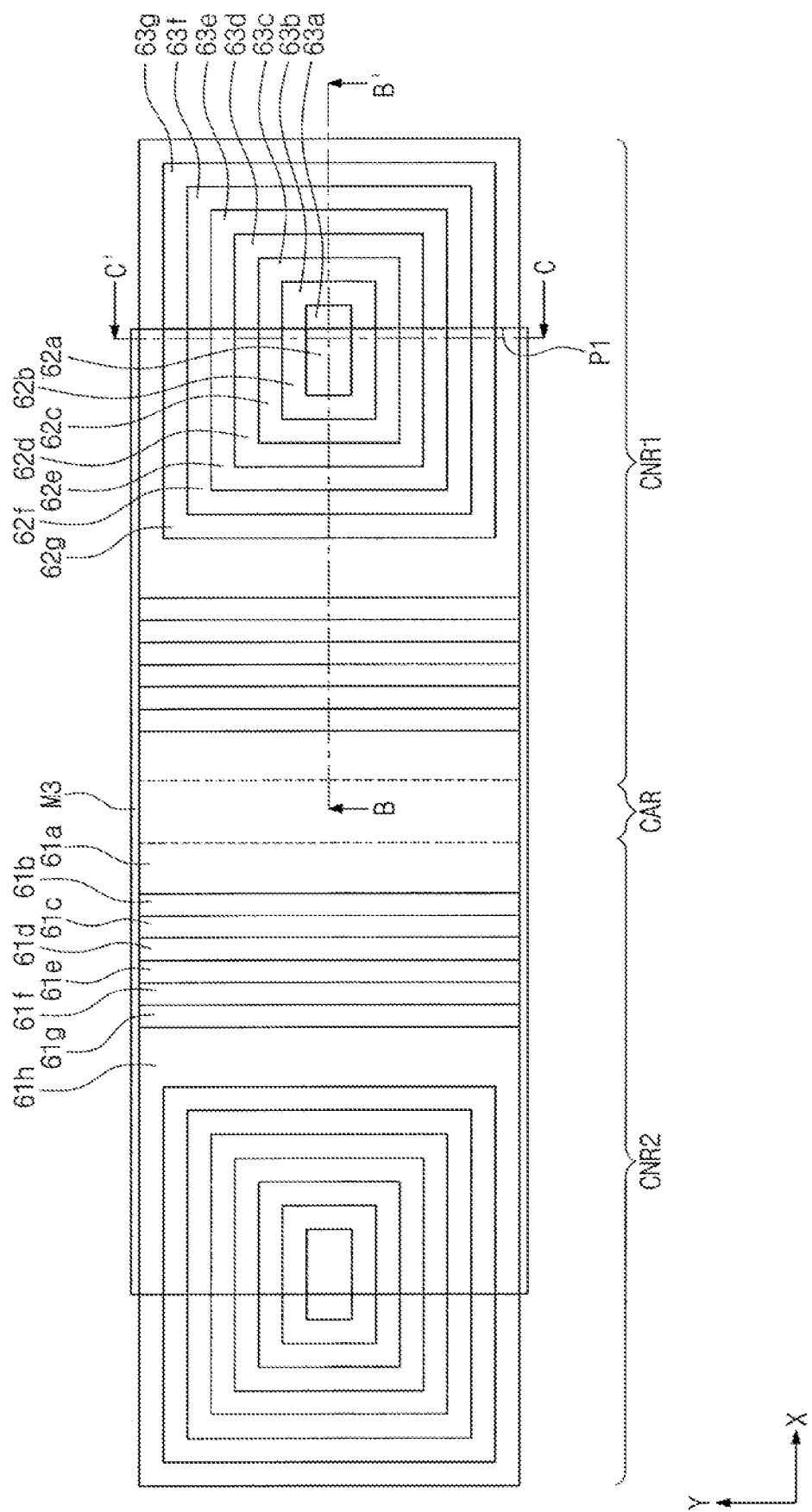
Figure 14B:
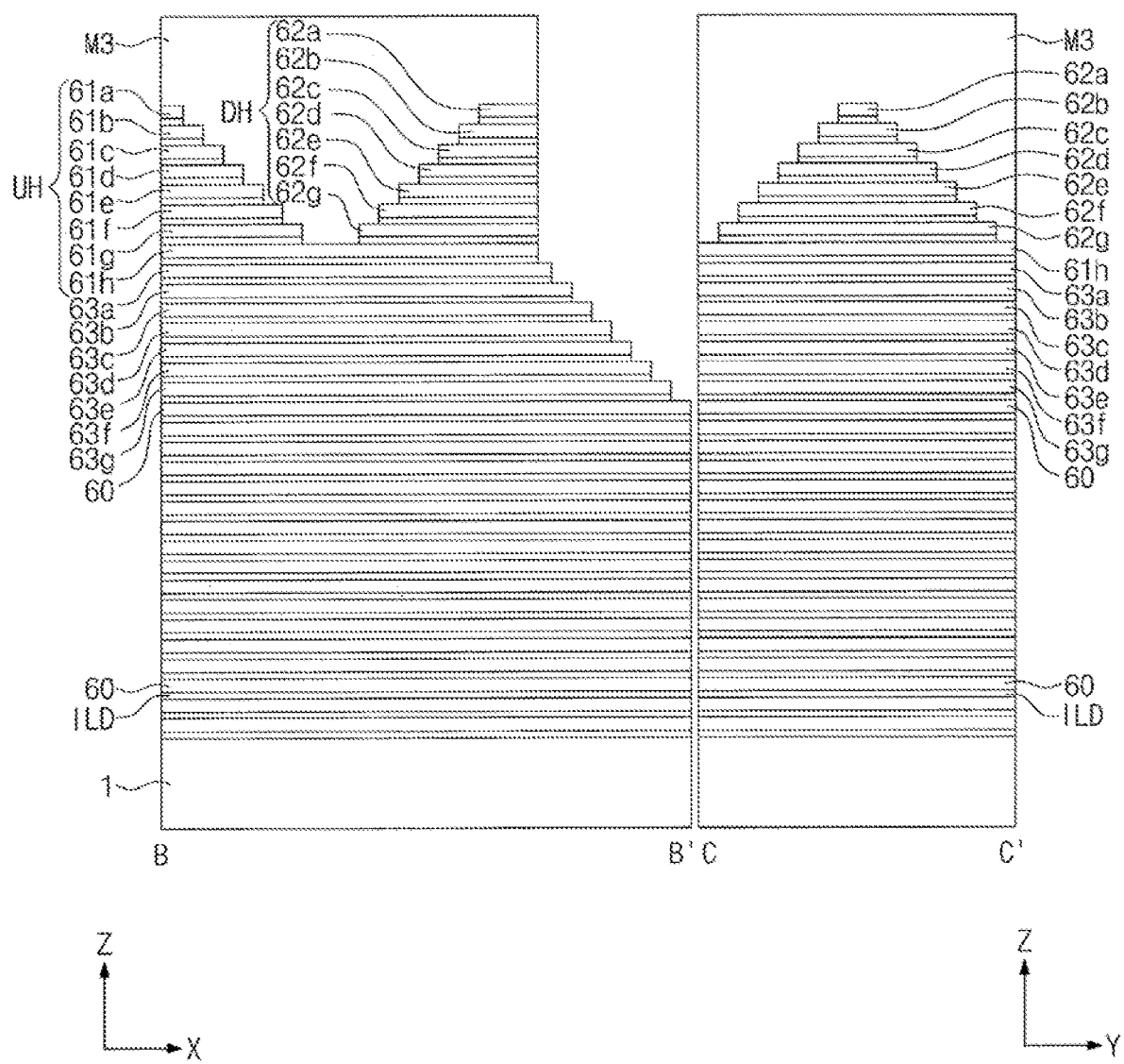
Figure 15B:
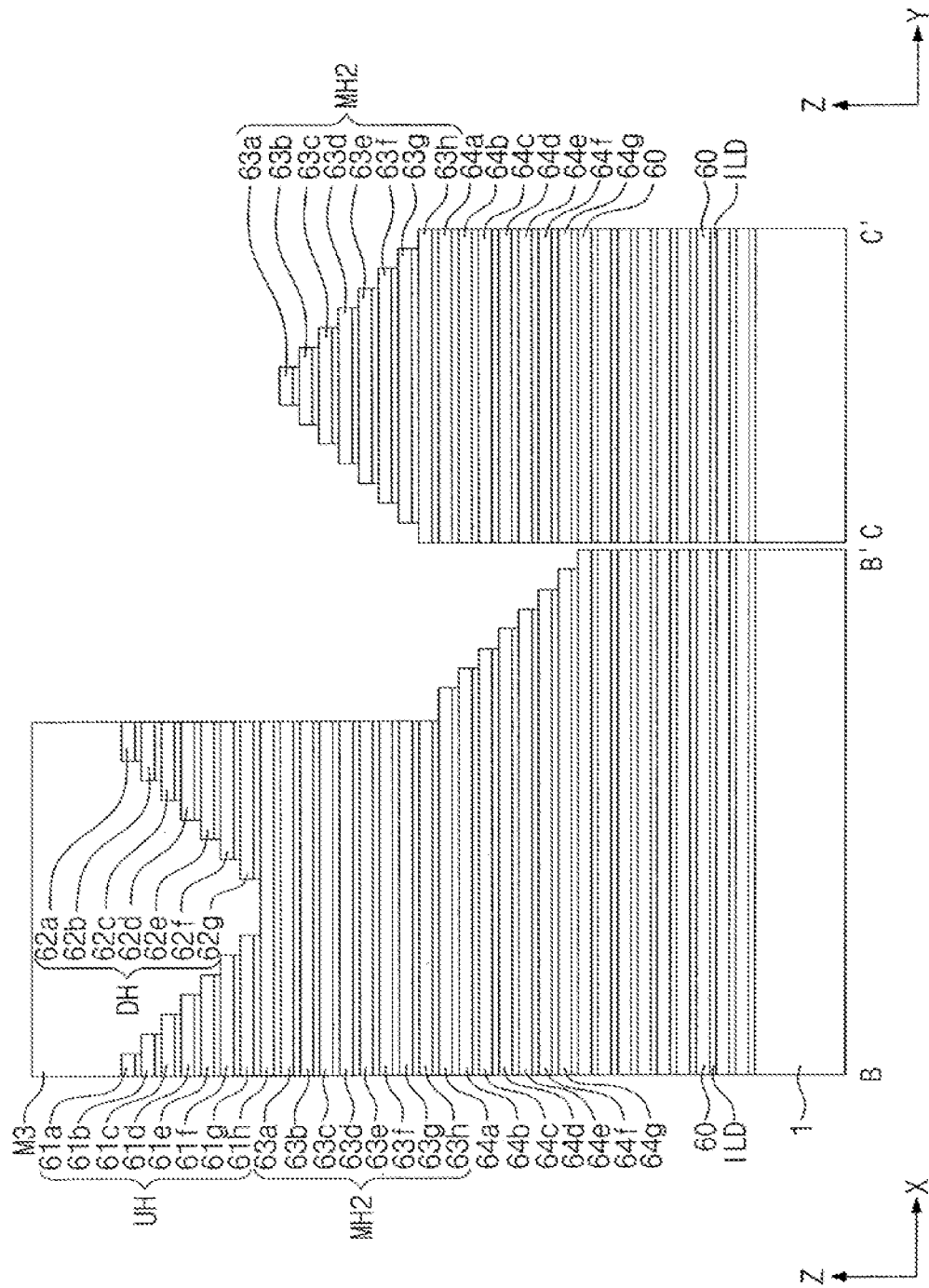

Referring to FIGS. 13A, 13B, 14A, and 14B, the first mask pattern M1 and the second mask patterns M2 may be removed to expose top surfaces of the (1a)-th horizontal pattern 61a and the (2a)-th horizontal pattern 62a. Thereafter, a third mask pattern M3 may be formed thereon. For example, the third mask pattern M3 may be formed to cover the cell array region CAR and portions of the first and second connection regions CNR1 and CNR2 adjacent thereto and to expose end portions of the first and second connection regions CNR1 and CNR2. In an implementation, the third mask pattern M3 may cover all of the end portions of the (1a)-th to (1g)-th horizontal patterns 61a-61g and portions of the (2a)-th to (2g)-th horizontal patterns 62a-62g and expose other portions of the (2a)-th to (2g)-th horizontal patterns 62a-62g. A sidewall of the third mask pattern M3 may be positioned at a first position P1, as shown in FIG. 14A. The third mask pattern M3 may be a photoresist pattern. An etching process may be performed using the third mask pattern M3 as an etch mask. Here, the etching process may be performed to etch eight pairs of the horizontal and insulating layers 60 and ILD at a time. As a result of the etching process, an (1h)-th horizontal pattern 61h and (3a)-th to (3g)-th horizontal patterns 63a-63g may be formed and a top surface of the horizontal layer 60 thereunder may be exposed. A sidewall of the (1h)-th horizontal pattern 61h may be aligned to a sidewall of the third mask pattern M3. The shapes of the end portions of the (2a)-th to (2g)-th horizontal patterns 62a-62g may be transferred to the (3a)-th to (3g)-th horizontal patterns 63a-63g such that the end portions of the (3a)-th to (3g)-th horizontal patterns 63a-63g form a staircase structure. The (1a)-th to (1h)-th horizontal patterns 61a-61h may constitute an upper horizontal structure UH. The (2a)-th to (2g)-th horizontal patterns 62a-62g may constitute a dummy horizontal structure DH.

Referring to FIGS. 14A, 14B, 15A, and 15B, a second trimming process may be performed to reduce a size of the third mask pattern M3. Thus, the sidewall of the third mask pattern M3 may be positioned at a second position P2, which is shifted from the first position P1 toward the cell array region CAR. An etching process may be performed using the shrunk third mask pattern M3 as an etch mask. Here, the etching process may also be performed to etch eight pairs of the horizontal and insulating layers 60 and ILD at a time. As a result, a (3h)-th horizontal pattern 63h and (4a)-th to (4g)-th horizontal patterns 64a-64g may be formed. The (3a)-th to (3h)-th horizontal patterns 63a-63h may constitute a second intermediate horizontal structure MH2. The staircase structure, which are defined by the end portions of the (3a)-th to (3g)-th horizontal patterns 63a-63g, may be transferred to the (4a)-th to (4g)-th horizontal patterns 64a-64g such that the end portions of the (4a)-th to (4g)-th horizontal patterns 64a-64g form a staircase structure.

Referring to FIGS. 15A, 15B, 16A, and 16B, a second trimming process may be performed to reduce a size of the third mask pattern M3. Thus, the sidewall of the third mask pattern M3 may be positioned at a third position P3, which is shifted from the second position P2 toward the cell array region CAR. An etching process may be performed using the shrunk third mask pattern M3 as an etch mask. Here, the etching process may also be performed to etch eight pairs of the horizontal and insulating layers 60 and ILD at a time. As a result, a (4h)-th horizontal pattern 64h and (5a)-th to (5h)-th horizontal patterns 65a-65h may be formed. The (4a)-th to (4h)-th horizontal patterns 64a-64h may constitute a first intermediate horizontal structure MH1. The staircase structure, which are defined by the end portions of the (4a)-th to (4g)-th horizontal patterns 64a-64g, may be transferred to the (5a)-th to (5h)-th horizontal patterns 65a-65h such that the end portions of the (5a)-th to (5h)-th horizontal patterns 65a-65h form a staircase structure. The (5a)-th to (5h)-th horizontal patterns 65a-65h may constitute a lower horizontal structure LH. The second trimming processes may be performed to reduce a width, in the first direction X, of the third mask pattern M3 in a stepwise manner.

Figure 16A:
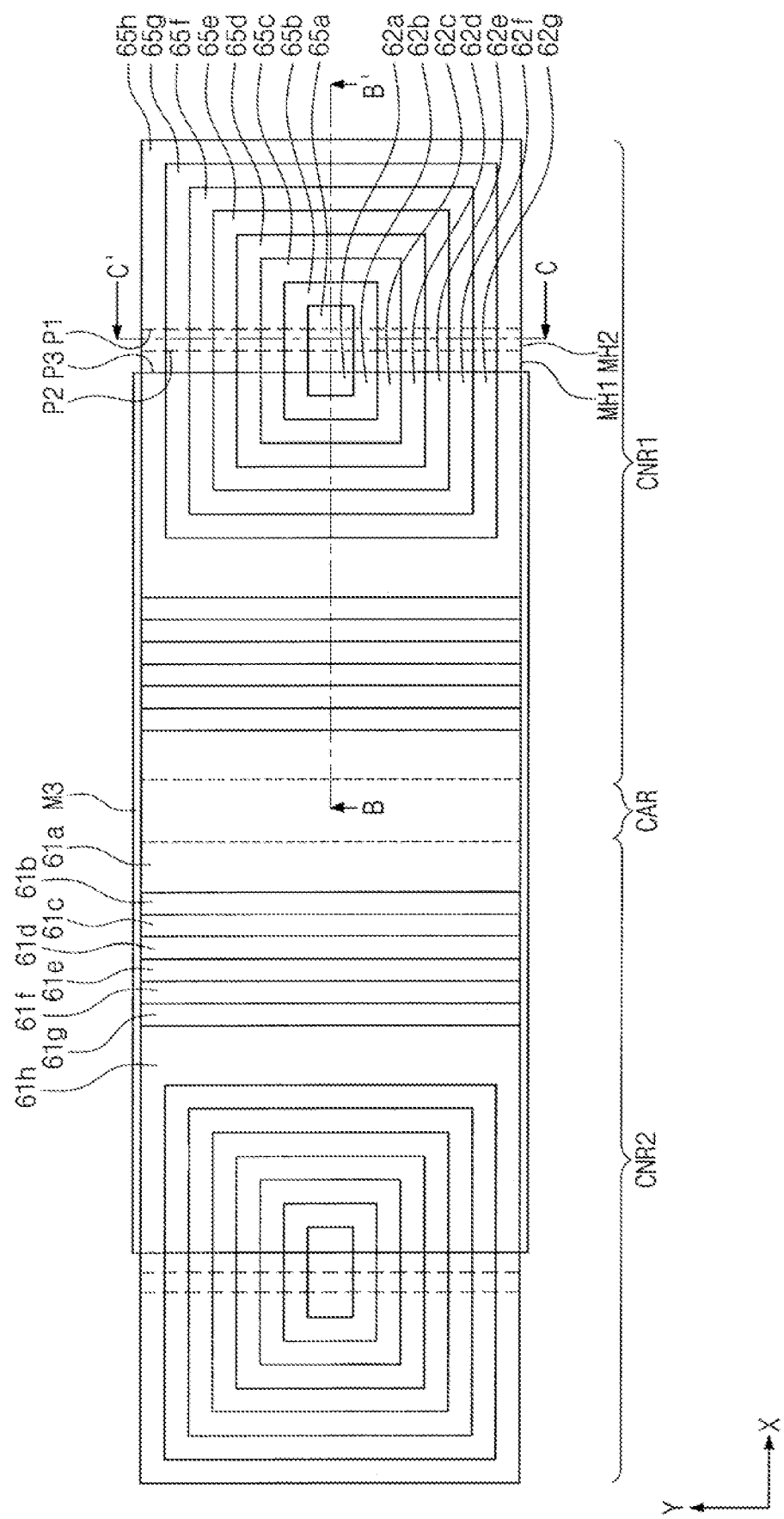

Referring to FIGS. 16A and 16B, the (4a)-th to (4h)-th horizontal patterns 64a-64h constituting the first intermediate horizontal structure MH1 may have fourth sidewalls SW4, which are exposed in the first direction X and are vertically aligned to each other. The (3a)-th to (3h)-th horizontal patterns 63a-63h constituting the second intermediate horizontal structure MH2 may have fifth sidewalls SW5, which are exposed in the first direction X and are vertically aligned to each other. The (2a)-th to (2g)-th horizontal patterns 62a-62g constituting the dummy horizontal structure DH may have sixth sidewalls SW6, which are exposed in the first direction X and are vertically aligned to each other.

A position of the fourth sidewall SW4 may correspond to the first position P1, like the third sidewall SW3 of FIG. 7. A position of the fifth sidewall SW5 may correspond to the second position P2, like the second sidewall SW2 of FIG. 7. A position of the sixth sidewall SW6 may correspond to the third position P3, like the first sidewall SW1 of FIG. 7.

Thereafter, as shown in FIGS. 16A, 16B, 4, and 10, the vertical channels VS and the dummy vertical channels DVS may penetrate the lower horizontal structure LH, the first and second intermediate horizontal structures MH1 and MH2, and the upper horizontal structure UH. Next, the lower horizontal structure LH, the first and second intermediate horizontal structures MH1 and MH2, the upper horizontal structure UH, and the dummy horizontal structure DH may be etched to form the block separation region SR1 of FIG. 4, and then, a replacement process may be performed to replace the horizontal patterns with conductive patterns through the block separation region SR1. Next, the common source plug CSP and the sidewall insulating spacer SP may be formed in the block separation region SR1.

Figure 17:
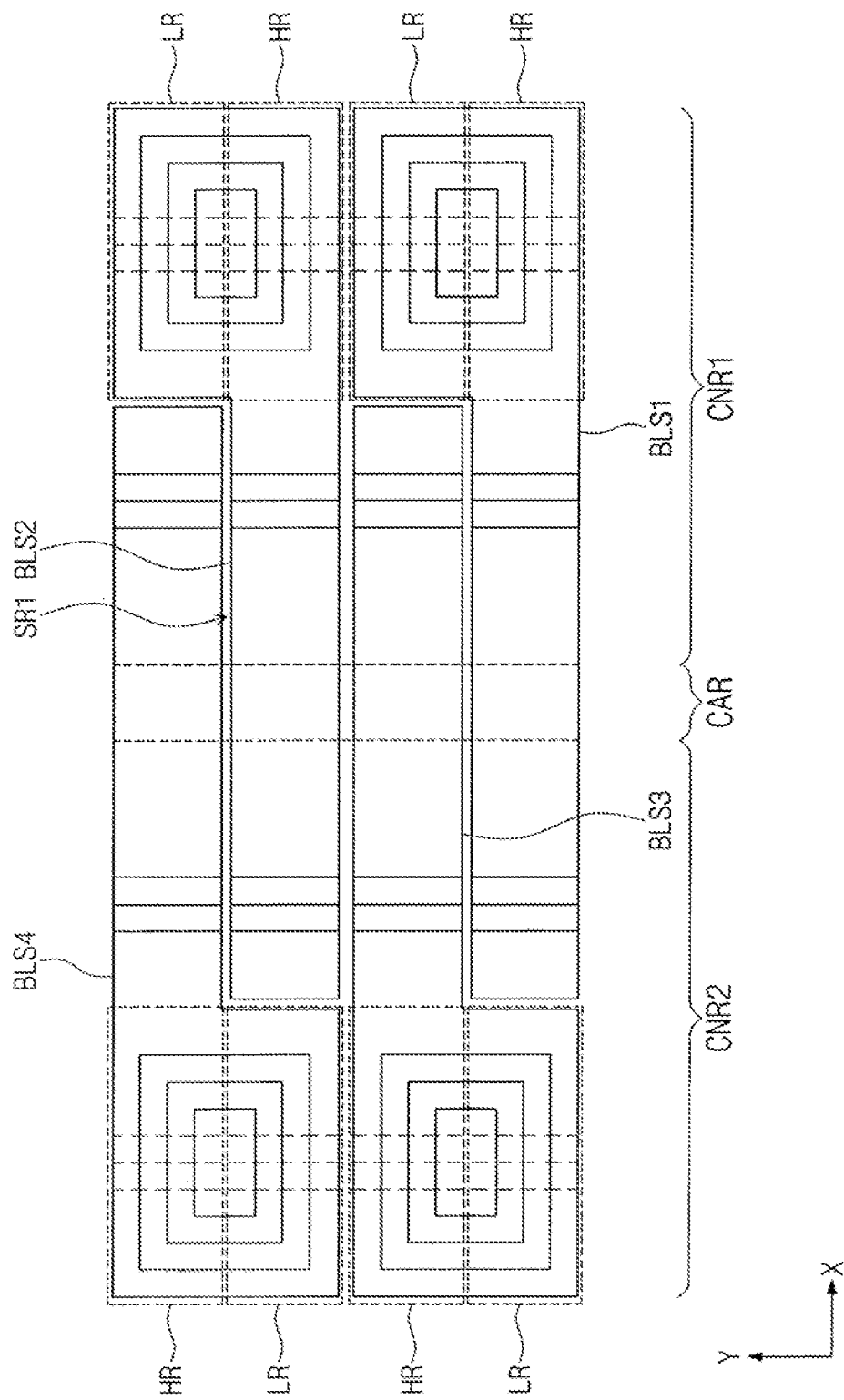
FIG. 17 illustrates a plan view of a three-dimensional semiconductor memory device according to example embodiments.
Figure 18:
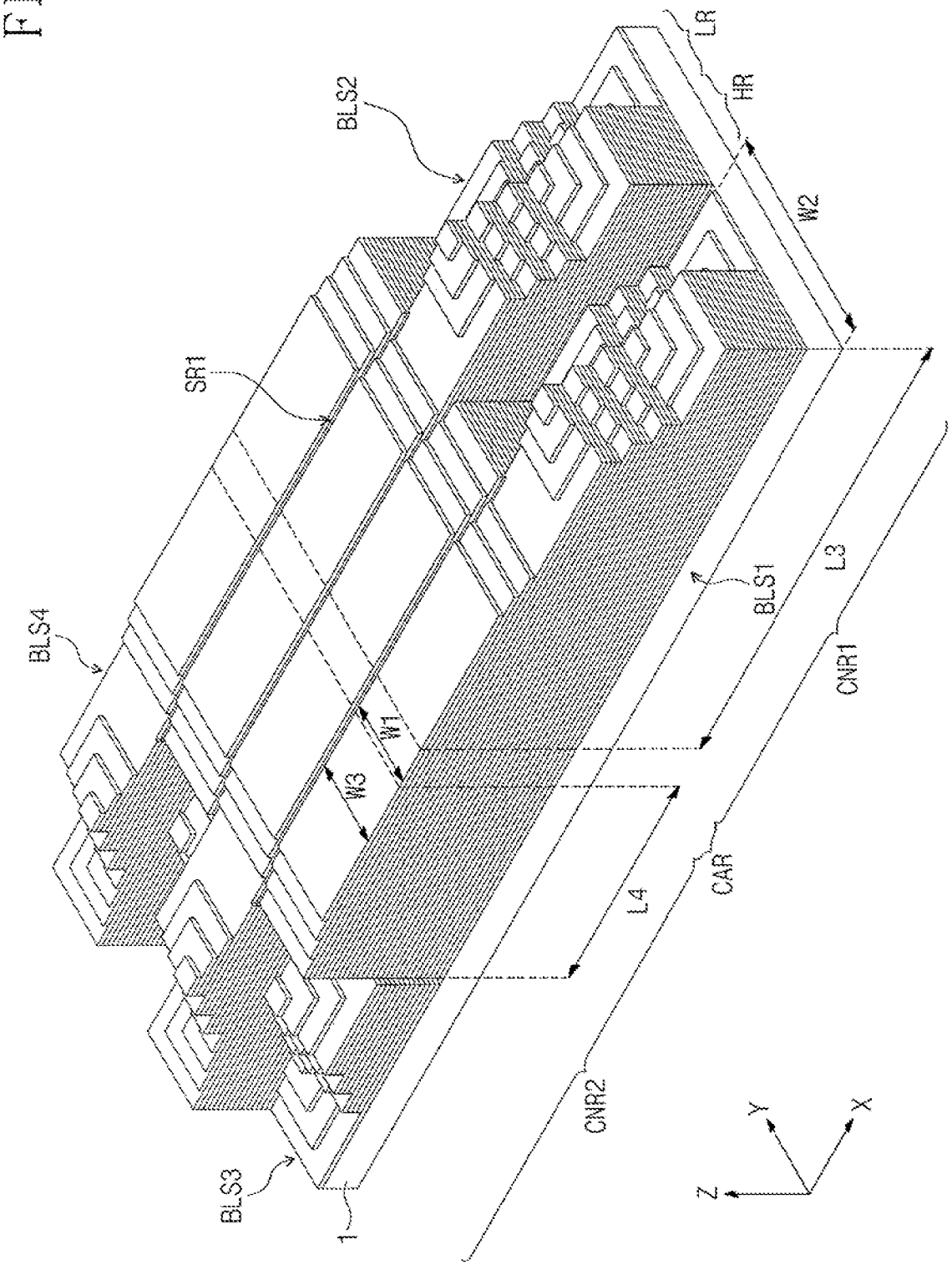
FIG. 18 illustrates a perspective view of an electrode structure, which is provided in a three-dimensional semiconductor memory device according to example embodiments and has the same planar structure as that of FIG. 17.

FIG. 17 illustrates a plan view of a three-dimensional semiconductor memory device according to example embodiments. FIG. 18 illustrates a perspective view of an electrode structure, which is provided in a three-dimensional semiconductor memory device according to example embodiments and has the same planar structure as that of FIG. 17.

Referring to FIGS. 17 and 18, a substrate 1 may be provided. The substrate 1 may include a first connection region CNR1 and a second connection region CNR2, which are spaced apart from each other, and a cell array region CAR, which is between the first and second connection regions CNR1 and CNR2. First to fourth block structures BLS1, BLS2, BLS3, and BLS4, which are spaced apart from each other, may be on the substrate 1. Each of the first to fourth block structures BLS1, BLS2, BLS3, and BLS4 may have an 'L'-shaped planar structure. The second block structure BLS2 may have the same structure as the first block structure BLS1 translationally moved in a second direction Y. The third block structure BLS3 may have the same structure as the first block structure BLS1 rotated by 180°. The fourth block structure BLS4 may have the same structure as the second block structure BLS2 rotated by 180°. The third block structure BLS3 and the first block structure BLS1 may have an interlocking structure. The fourth block structure BLS4 and the second block structure BLS2 may have an interlocking structure. A block separation region SR1 may be between the first to fourth block structures BLS1, BLS2, BLS3, and BLS4. The block separation region SR1 may have a zigzag shape, when viewed in a plan view.

The first to fourth block structures BLS1, BLS2, BLS3, and BLS4 may be elongated (e.g., may have a greatest length) in a first direction X. The first connection region CNR1, the cell array region CAR, and the second connection region CNR2 may be arranged in the first direction X or in an opposite direction. A width of the first block structure BLS1 on the cell array region CAR may be a first width W1, when measured in the second direction Y crossing the first direction X. A width of the first block structure BLS1 in the second direction Y on the first connection region CNR1 may be a second width W2. A width of the first block structure BLS1 in the second direction Y on the second connection region CNR2 may be a third width W3. The second width W2 may be larger than the first width W1. The first width W1 may be substantially equal to the third width W3. The second block structure BLS2 may have the same width relationship as that of the first block structure BLS1. By contrast, a width of each of the third and fourth block structures BLS3 and BLS4 in the second direction Y may be larger on the second connection region CNR2 than on the first connection region CNR1.

A length of the first block structure BLS1 on the first connection region CNR1 may be a third length L3, when measured in the first direction X. A length of the first block structure BLS1 on the second connection region CNR2 may be a fourth length L4, when measured in the first direction X. The third length L3 may be larger than the fourth length L4. The second block structure BLS2 may have the same length relationship as that of the first block structure BLS1. By contrast, a length of each of the third and fourth block structures BLS3 and BLS4 in the first direction X may be smaller on the first connection region CNR1 than on the second connection region CNR2.

When viewed in a plan view, the first block structure BLS1 may be bent in the second direction Y on the first connection region CNR1 and may be adjacent to an end portion of the third block structure BLS3. The second block structure BLS2 may be bent in the second direction Y on the first connection region CNR1 and may be adjacent to an end portion of the fourth block structure BLS4. The third block structure BLS3 may be bent in a direction opposite to the second direction Y on the second connection region CNR2 and may be adjacent to an end portion of the first block structure BLS1. The fourth block structure BLS4 may be bent in the direction opposite to the second direction Y on the second connection region CNR2 and may be adjacent to an end portion of the second block structure BLS2.

Each of the first and second block structures BLS1 and BLS2 may have a high region HR and a low region LR, on the first connection region CNR1. A planar structure of the high region HR may be symmetric with respect to a planar structure of the low region LR, but a top surface profile of the high region HR may be positioned at a higher level (e.g., farther from the substrate 1) than that of the low region LR. The high regions HR and the low regions LR on the first connection region CNR1 may be alternately arranged in the second direction Y. Each of the third and fourth block structures BLS3 and BLS4 may have the high region HR and the low region LR, on the second connection region CNR2. The high regions HR and the low regions LR on the second connection region CNR2 may be alternately arranged in a direction opposite to the second direction Y. In the present specification, the high region HR may be referred to as a first connecting portion, and the low region LR may be referred to as a second connecting portion.

Each of the first to fourth block structures BLS1, BLS2, BLS3, and BLS4 may have a staircase structure on the first and second connection regions CNR1 and CNR2. This will be described in more detail below.

Figure 19:
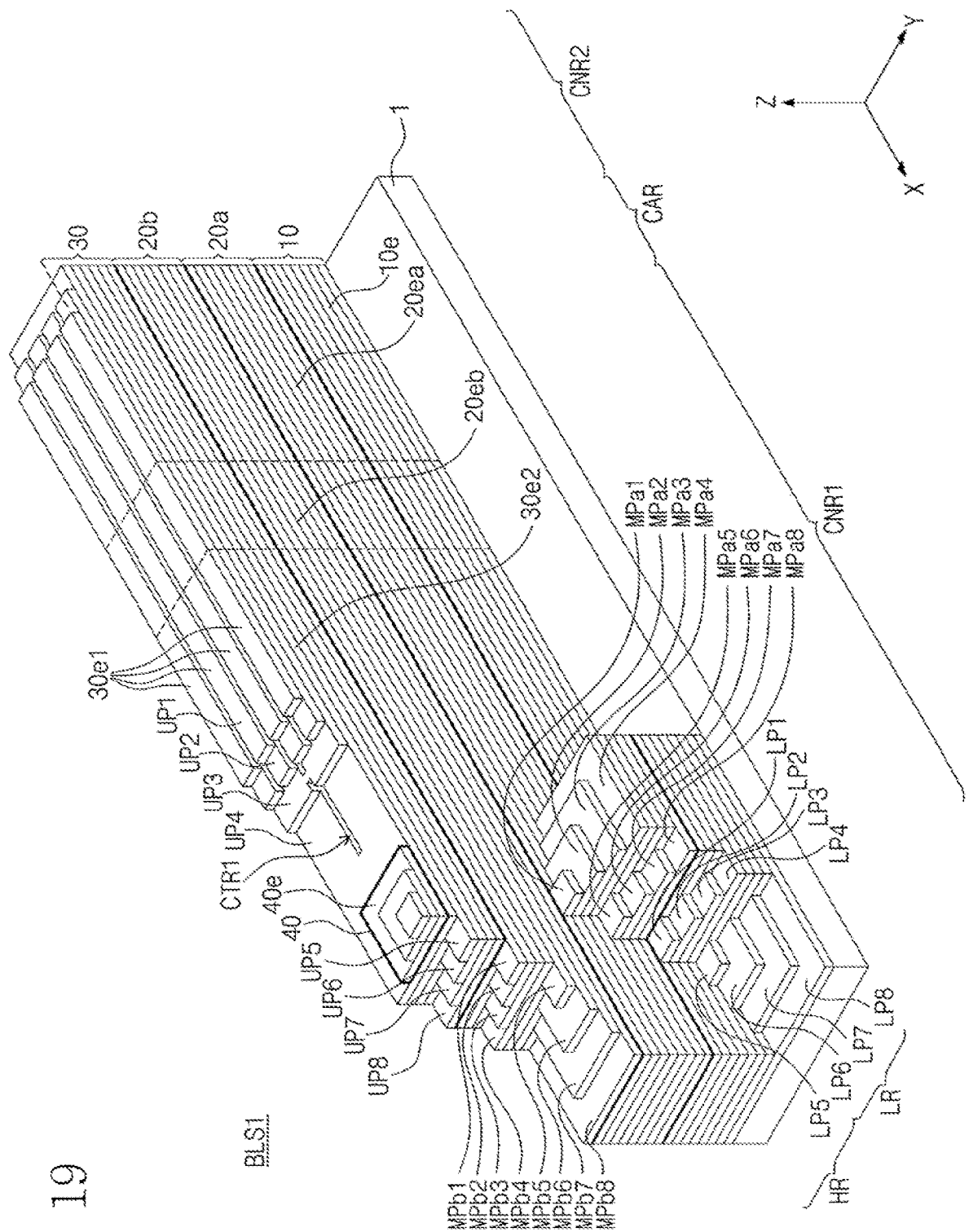
FIG. 19 illustrates a perspective view of a first block structure in the three-dimensional semiconductor memory device of FIG. 18.

FIG. 19 illustrates a perspective view of a first block structure in the three-dimensional semiconductor memory device of FIG. 18.

Referring to FIG. 19, the first block structure BLS1 may include a lower stack 10, first and second intermediate stacks 20a and 20b, and an upper stack 30, which are sequentially stacked on the substrate 1. Each of the second intermediate stack 20b and the upper stack 30 may be a bar-shaped structure that is extended in the first direction X, when viewed in a plan view. Each of the lower stack 10 and the first intermediate stack 20a may include a bar-shaped portion, which is extended in the first direction X, and a protruding portion, which is extended in the second direction Y and is coupled to the bar-shaped portion on the first connection region CNR1.

The lower stack 10 may include a plurality of lower electrodes 10e, which are vertically stacked on the substrate 1. The lower electrodes 10e may form a staircase structure on the first connection region CNR1. The lower electrodes 10e may have first to eighth lower pad regions LP1-LP8. The first to fourth lower pad regions LP1-LP4 may form a downward staircase structure in the second direction Y. The first to fourth lower pad regions LP1-LP4 may form a staircase structure having a decreasing thickness in the second direction Y. The fifth to eighth lower pad regions LP5-LP8 may form a downward staircase structure having a decreasing thickness in both of the first and second directions X and Y. The fifth to eighth lower pad regions LP5-LP8 may form a staircase structure having a decreasing thickness in both of the first and second directions X and Y. Each of the sixth to eighth lower pad regions LP6-LP8 may have an 'L'-shaped planar structure. In an implementation, the insulating layers ILD (e.g., see FIG. 10) may be between the lower stack 10 and the substrate 1 and between the lower electrodes 10e to vertically separate them from each other.

The first intermediate stack 20a may include a plurality of first intermediate electrodes 20ea, which are vertically stacked on the substrate 1. The first intermediate electrodes 20ea may form a staircase structure. The first intermediate electrodes 20ea may have (1a)-th to (8a)-th intermediate pad regions MPa1-MPa8. The (5a)-th to (8a)-th intermediate pad regions MPa5-MPa8 may form a downward staircase structure in the second direction Y. The (5a)-th to (8a)-th intermediate pad regions MPa5-MPa8 may form a staircase structure having a decreasing thickness in the second direction Y. The (1a)-th to (4a)-th intermediate pad regions MPa1-MPa4 may form a downward staircase structure in a direction opposite to the first direction X and in the second direction Y. The (1a)-th to (4a)-th intermediate pad regions MPa1-MPa4 may form a staircase structure having a decreasing thickness in a direction opposite to the first direction X and in the second direction Y. Each of the (2a)-th to (4a)-th intermediate pad regions MPa2-MPa4 may have an 'L'-shaped planar structure.

The second intermediate stack 20b may include a plurality of second intermediate electrodes 20eb, which are vertically stacked on the substrate 1. The second intermediate electrodes 20eb may form a staircase structure. The second intermediate electrodes 20eb may include (1b)-th to (8b)-th intermediate pad regions MPb1-MPb8. The (5b)-th to (8b)-th intermediate pad regions MPb5-MPb8 may form a staircase structure having a decreasing thickness in the first direction X and in a direction opposite to the second direction Y. Each of the (6b)-th to (8b)-th intermediate pad regions MPb6-MPb8 may have an 'L'-shaped planar structure. The (1b)-th to (4b)-th intermediate pad regions MPb1-MPb4 may form a staircase structure having a decreasing thickness in a direction opposite to the second direction Y.

The upper stack 30 may include second upper electrodes 30e2 and first upper electrodes 30e1, which are vertically stacked on the substrate 1. When viewed in a plan view, the first upper electrodes 30e1 may be line-shape patterns spaced apart from each other in the second direction Y. On the first and second connection regions CNR1 and CNR2, end portions of the first upper electrodes 30e1 may form a staircase structure. For example, the first upper electrodes 30e1 may include first and second upper pad regions UP1 and UP2 on the first connection region CNR1. The second upper electrodes 30e2 may include third to eighth upper pad regions UP3-UP8 on the first connection region CNR1. The fifth to eighth upper pad regions UP5-UP8 may form a downward staircase structure in a direction opposite to the second direction Y. The fifth to eighth upper pad regions UP5-UP8 may form a staircase structure having a decreasing thickness in a direction opposite to the second direction Y. The first to fourth upper pad regions UP1-UP4 may form a downward staircase structure in the first direction X. The first to fourth upper pad regions UP1-UP4 may form a staircase structure having a decreasing thickness in the first direction X.

On the first connection region CNR1, a dummy stack 40 may be on the fourth upper pad region UP4. The dummy stack 40 may include dummy electrodes 40e, which are vertically stacked on the substrate 1. The dummy electrodes 40e may form a downward staircase structure in a direction opposite to the first direction X and in a direction opposite to the second direction Y. The dummy electrodes 40e may form a staircase structure having a decreasing thickness in a direction opposite to the first direction X and in a direction opposite to the second direction Y.

The number of the first upper electrodes 30e1 at the highest level may be less than the number of the upper pad regions UP1-UP8. The number of the first upper electrodes 30e1 at the highest level may be less than the number of the (1a)-th to (8a)-th intermediate pad regions MPa1-MPa8. The number of the first upper electrodes 30e1 at the highest level may be less than the number of the (1b)-th to (8b)-th intermediate pad regions MPb1-MPb8. The number of the first upper electrodes 30e1 at the highest level may be less than the number of the lower pad regions LP1-LP8.

The first block structure BLS1 may have a high region HR and a low region LR, on the first connection region CNR1. The (1b)-th to (8b)-th intermediate pad regions MPb1-MPb8, the fourth to eighth upper pad regions UP4-UP8, and the dummy stack 40 may be provided in the high region HR. The (1a)-th to (8a)-th intermediate pad regions MPa1-MPa8 and the first to eighth lower pad regions LP1-LP8 may be in the low region LR. In the present embodiments, 16 steps may be between the highest portion of the high region HR and the highest portion of the low region LR. Other portion of the first block structure may be the same as, or similar to, that described with reference to FIG. 7.

A process of fabricating the three-dimensional semiconductor memory device of FIG. 19 may include repeating the first trimming process, the second trimming process, and the etching processes described with reference to FIGS. 11A to 16A and FIGS. 11B to 16B several times, and during this process, the low regions LR may be further etched using an additional mask.

Figure 20:
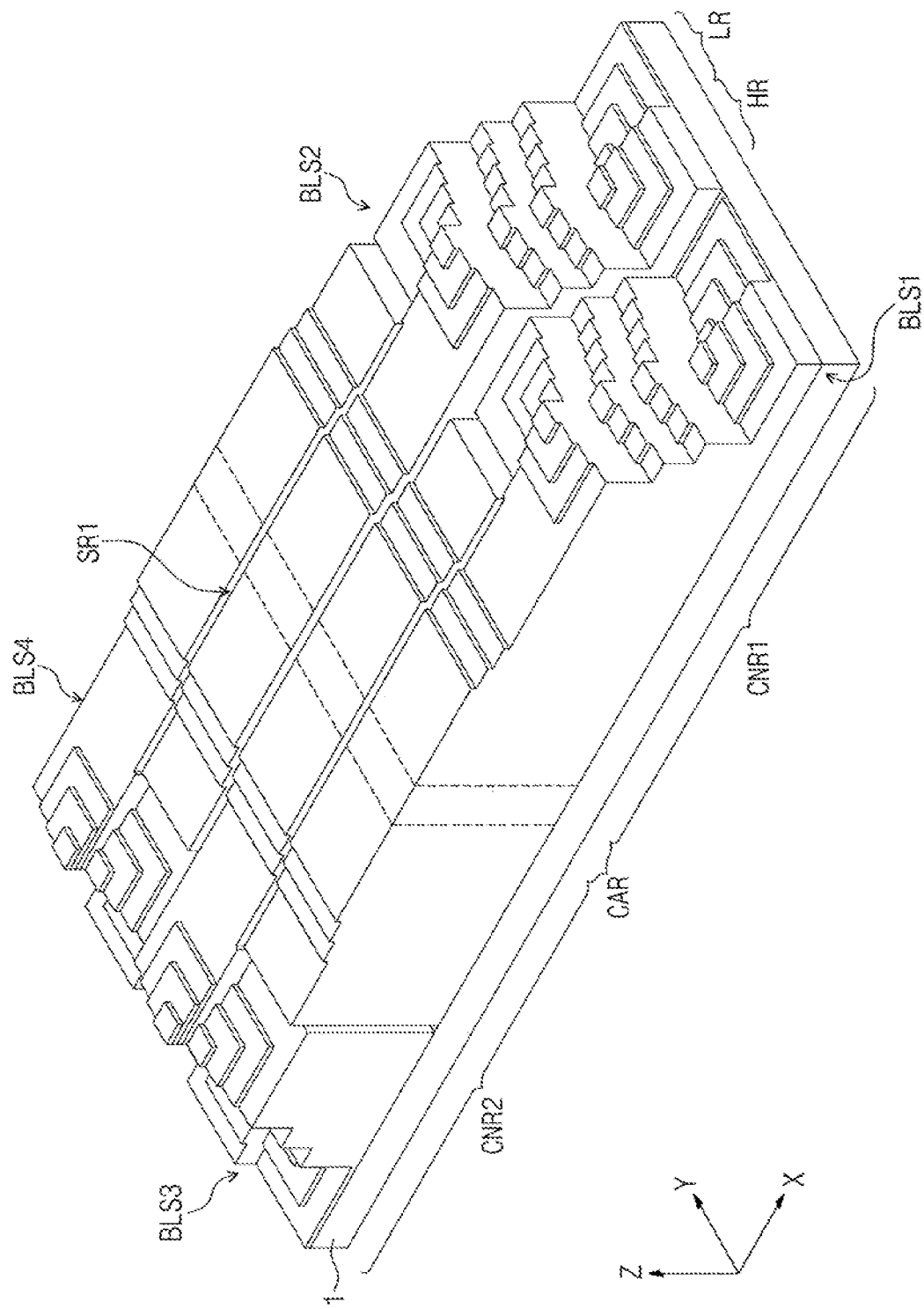
FIG. 20 illustrates a perspective view of an electrode structure, which is provided in a three-dimensional semiconductor memory device according to example embodiments and has the same planar structure as that of FIG. 17.
Figure 21:
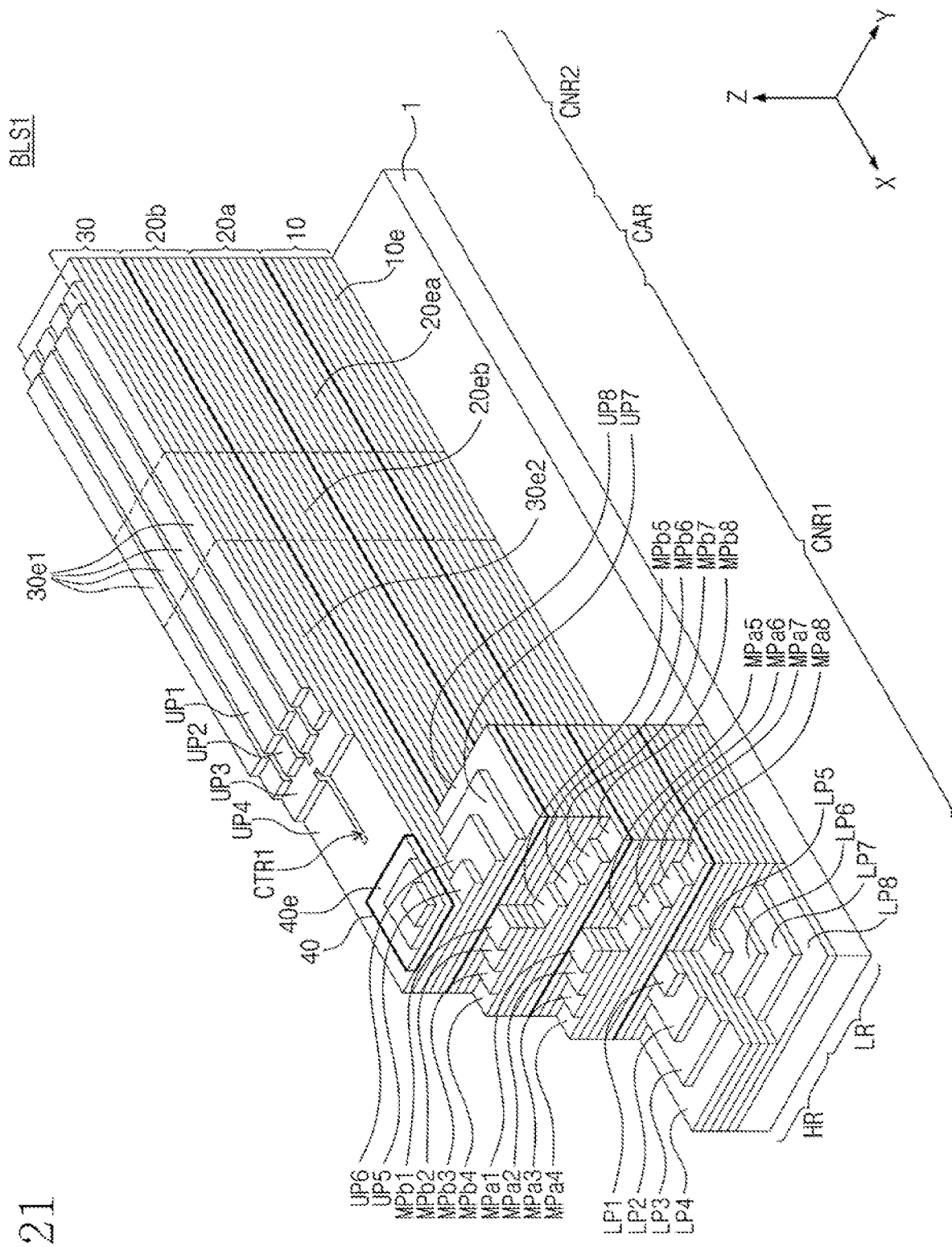
FIG. 21 illustrates a perspective view of a first block structure in the three-dimensional semiconductor memory device of FIG. 20.

FIG. 20 illustrates a perspective view of an electrode structure, which is provided in a three-dimensional semiconductor memory device according to example embodiments and has the same planar structure as that of FIG. 17. FIG. 21 illustrates a perspective view of a first block structure in the three-dimensional semiconductor memory device of FIG. 20.

Referring to FIGS. 20 and 21, a substrate 1 may be provided. The substrate 1 may include a first connection region CNR1 and a second connection region CNR2, which are spaced apart from each other, and a cell array region CAR, which is between the first and second connection regions CNR1 and CNR2. First to fourth block structures BLS1, BLS2, BLS3, and BLS4, which are spaced apart from each other, may be on the substrate 1. The first to fourth block structures BLS1, BLS2, BLS3, and BLS4, which are spaced apart from each other, may be similar to that described with reference to FIGS. 17 and 18. However, in each of the first to fourth block structures BLS1, BLS2, BLS3, and BLS4, the high regions HR and low regions LR may be different from the block structure of FIGS. 17 and 18 in terms of structure and height. This will be described in more detail below.

Referring to FIG. 21, the first block structure BLS1 may include a lower stack 10, first and second intermediate stacks 20a and 20b, and an upper stack 30, which are sequentially stacked on the substrate 1. Each of the lower stack 10, the first and second intermediate stacks 20a and 20b, and the upper stack 30 may include a bar-shaped portion, which is extended in the first direction X, and a protruding portion, which is extended in the second direction Y and is coupled to the bar-shaped portion on the first connection region CNR1.

The lower stack 10 may include a plurality of lower electrodes 10e, which are vertically stacked on the substrate 1. The lower electrodes 10e may form a staircase structure on the first connection region CNR1. The lower electrodes 10e may have first to eighth lower pad regions LP1-LP8. The first to fourth lower pad regions LP1-LP4 may form a staircase structure having a decreasing thickness in a direction opposite to the second direction Y and in the first direction X. Each of the second to fourth lower pad regions LP2-LP4 may have an 'L'-shaped planar structure. The fifth to eighth lower pad regions LP5-LP8 may form a staircase structure having a decreasing thickness in both of the first and second directions X and Y. Each of the sixth to eighth lower pad regions LP6-LP8 may have an 'L'-shaped planar structure. The first to fourth lower pad regions LP1-LP4 may have a symmetric structure with respect to the fifth to eighth lower pad regions LP5-LP8, when viewed in a plan view.

The first intermediate stack 20a may include a plurality of first intermediate electrodes 20ea, which are vertically stacked on the substrate 1. The first intermediate electrodes 20ea may form a staircase structure. The first intermediate electrodes 20ea may have (1a)-th to (8a)-th intermediate pad regions MPa1-MPa8. The (5a)-th to (8a)-th intermediate pad regions MPa5-MPa8 may form a staircase structure having a decreasing thickness in the second direction Y. The (1a)-th to (4a)-th intermediate pad regions MPa1-MPa4 may form a staircase structure having a decreasing thickness in a direction opposite to the second direction Y.

The second intermediate stack 20b may include a plurality of second intermediate electrodes 20eb, which are vertically stacked on the substrate 1. The second intermediate electrodes 20eb may form a staircase structure. The second intermediate electrodes 20eb may include (1b)-th to (8b)-th intermediate pad regions MPb1-MPb8. The (5b)-th to (8b)-th intermediate pad regions MPb5-MPb8 may form a staircase structure having a decreasing thickness in the second direction Y. The (1b)-th to (4b)-th intermediate pad regions MPb1-MPb4 may form a staircase structure having a decreasing thickness in a direction opposite to the second direction Y.

The upper stack 30 may include second upper electrodes 30e2 and first upper electrodes 30e1, which are vertically stacked on the substrate 1. When viewed in a plan view, the first upper electrodes 30e1 may be line-shape patterns spaced apart from each other in the second direction Y. On the first and second connection regions CNR1 and CNR2, end portions of the first upper electrodes 30e1 may form a staircase structure in the first direction X and may be spaced apart from each other. For example, the first upper electrodes 30e1 may include first and second upper pad regions UP1 and UP2 on the first connection region CNR1. The second upper electrodes 30e2 may include third to eighth upper pad regions UP3-UP8 on the first connection region CNR1. The fifth to eighth upper pad regions UP5-UP8 may form a staircase structure having a decreasing thickness in the second direction Y. The fifth to eighth upper pad regions UP5-UP8 may form a staircase structure having a decreasing thickness in a direction opposite to the first direction X. Each of the sixth to eighth upper pad regions UP6-UP8 may have an 'L'-shaped planar structure. The first to fourth upper pad regions UP1-UP4 may form a staircase structure having a decreasing thickness in the first direction X.

On the first connection region CNR1, a dummy stack 40 may be on the fourth upper pad region UP4. The dummy stack 40 may include dummy electrodes 40e, which are vertically stacked on the substrate 1. The dummy electrodes 40e may form an upward staircase structure in the first and second directions X and Y. The dummy electrodes 40e may form a staircase structure having an increasing thickness in the first and second directions X and Y.

The first block structure BLS1 may have a high region HR and a low region LR, on the first connection region CNR1. The fourth upper pad region UP4, the dummy stack 40, the (1a)-th to (4a)-th intermediate pad regions MPa1-MPa4, the (1b)-th to (4b)-th intermediate pad regions MPb1-MPb4, and the first to fourth lower pad regions LP1-LP4 may be in the high region HR. The fifth to eighth upper pad regions UP5-UP8, the (5a)-th to (8a)-th intermediate pad regions MPa5-MPa8, the (5b)-th to (8b)-th intermediate pad regions MPb5-MPb8, and the fifth to eighth lower pad regions LP5-LP8 may be in the low region LR. In the present embodiments, 4 steps may be formed between the highest portion of the high region HR and the highest portion of the low region LR. Other portion may be the same as, or similar to, that described with reference to FIG. 19.

A process of fabricating the three-dimensional semiconductor memory device of FIG. 21 may include repeating the first trimming process, the second trimming process, and the etching processes described with reference to FIGS. 11A to 16A and FIGS. 11B to 16B several times, and during this process, the low regions LR may be further etched using an additional mask.

Figure 22:
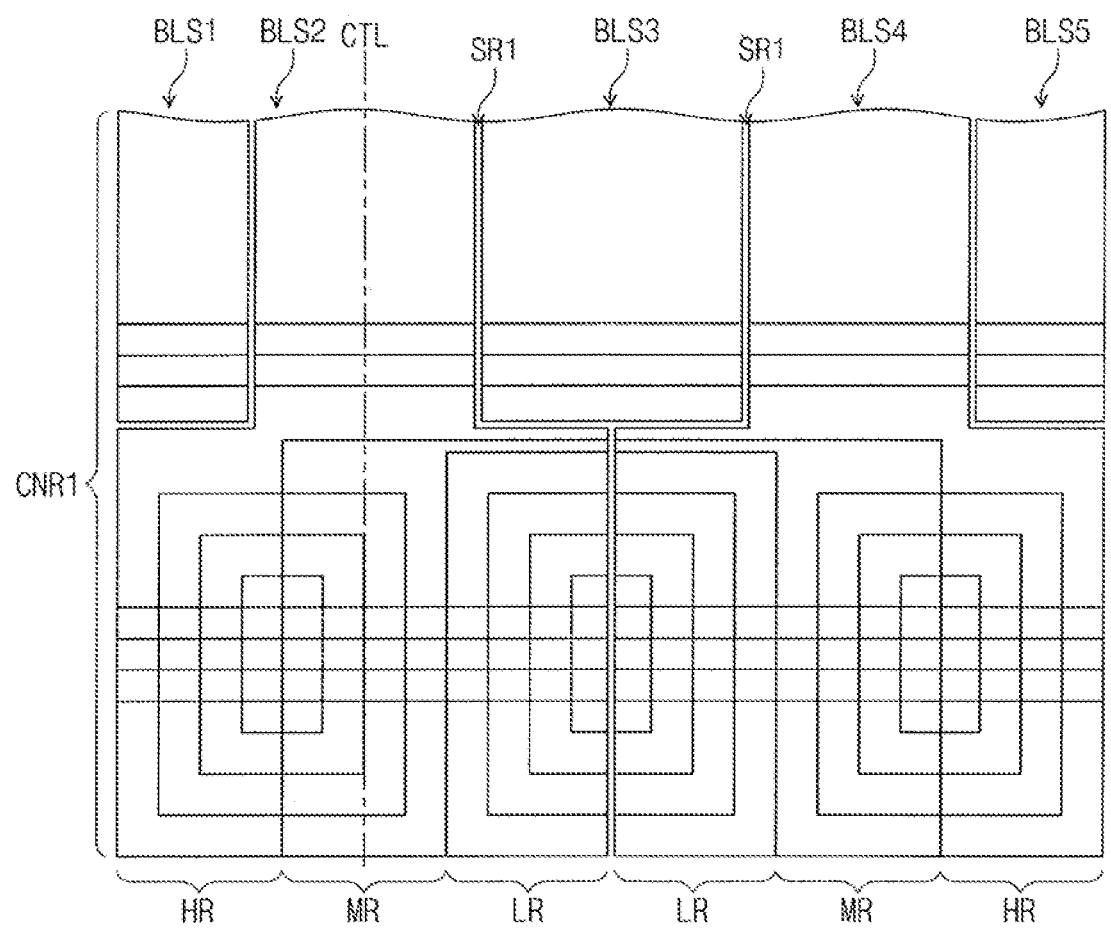
FIG. 22 illustrates a plan view of a portion of a three-dimensional semiconductor memory device according to example embodiments.
Figure 23:
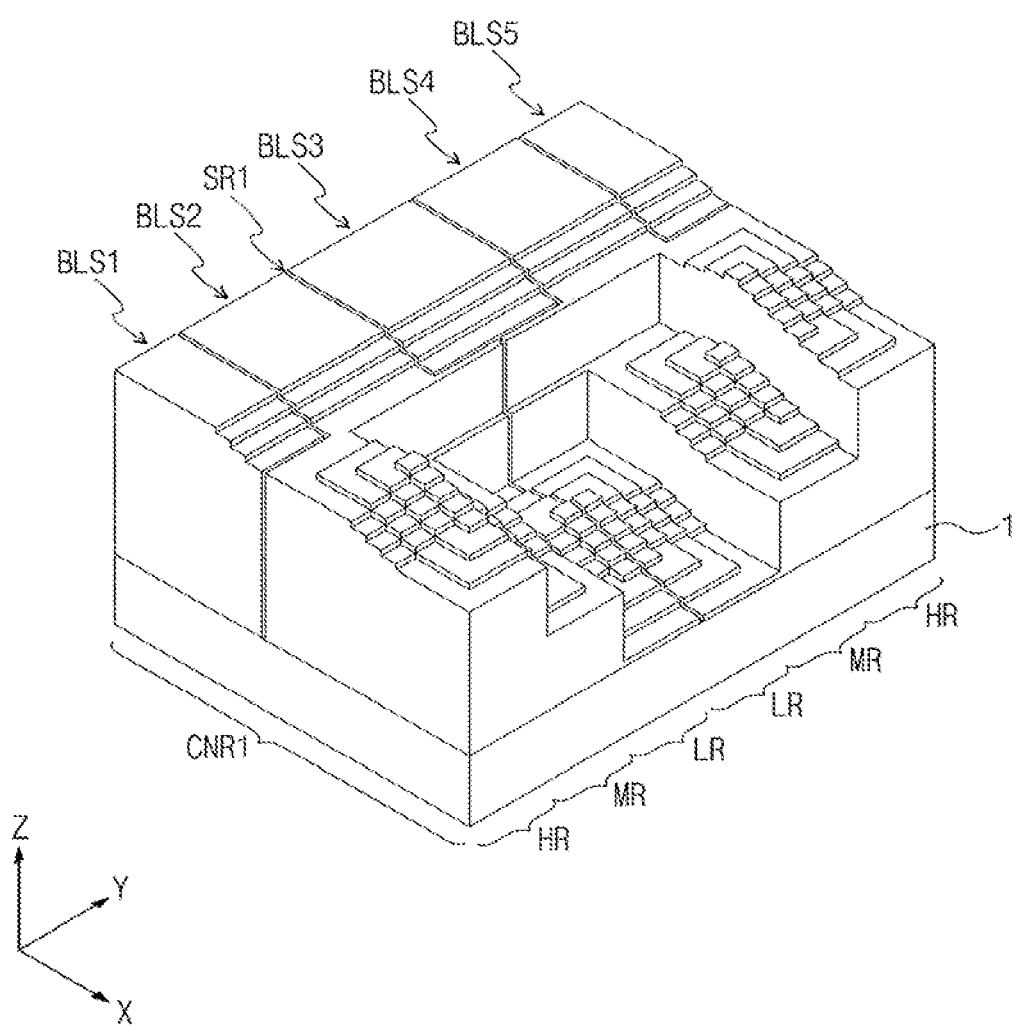
FIG. 23 illustrates a perspective view of a portion, which is provided in a three-dimensional semiconductor memory device and has the same planar structure as that of FIG. 22.

FIG. 22 illustrates a plan view of a portion of a three-dimensional semiconductor memory device according to example embodiments. FIG. 23 illustrates a perspective view of a portion, which is provided in a three-dimensional semiconductor memory device and has the same planar structure as that of FIG. 22.

Referring to FIGS. 22 and 23, at least some of block structures BLS1-BLS5 may include end portions, each of which has a 'T'-shaped planar structure. For example, the second block structure BLS2 and the fourth block structure BLS4 may have the 'T'-shaped planar structure on the first connection region CNR1. The fourth block structure BLS4 may have a symmetric structure with respect to the second block structure BLS2. An end portion of the second block structure BLS2 may include a high region HR, an intermediate region MR, and a low region LR. On the high region HR, the intermediate region MR, and the low region LR, pad regions may be at different levels to form staircase structures in the first direction X and the second direction Y. The highest portion of the intermediate region MR may be lower than the highest (or lowest) portion of the high region HR and higher than the highest portion of the low region. When viewed in a plan view, the pad regions in the intermediate region MR may have a symmetric structure with respect to the pad regions in the high region HR. When viewed in a plan view, the pad regions in the intermediate region MR may have a symmetric structure with respect to the pad regions in the low region LR. When viewed in a plan view, the intermediate region MR may be provided on a center line CTL of the second block structure BLS2 parallel to the first direction X, and the high region HR and the low region LR may be provided at both sides of the intermediate region MR.

A process of fabricating the three-dimensional semiconductor memory device of FIG. 23 may include repeating the first trimming process, the second trimming process, and the etching processes described with reference to FIGS. 11A to 16A and FIGS. 11B to 16B several times, and during this process, the low regions LR may be further etched using an additional mask. Here, a third trimming process may be further performed on a fourth mask pattern, which is used to etch the intermediate regions MR and the low regions LR. The third trimming processes may be performed to reduce a width, in the second direction Y, of the fourth mask pattern, in a stepwise manner.

Figure 24:
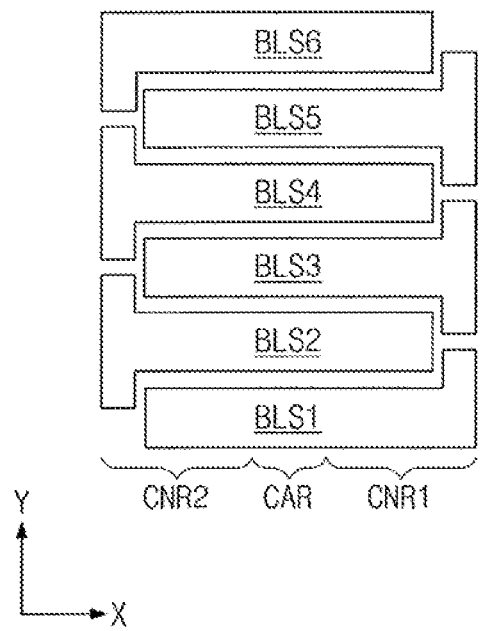
FIGS. 24 and 25 illustrate plan views of a portion of a three-dimensional semiconductor memory device according to example embodiments.
Figure 25:
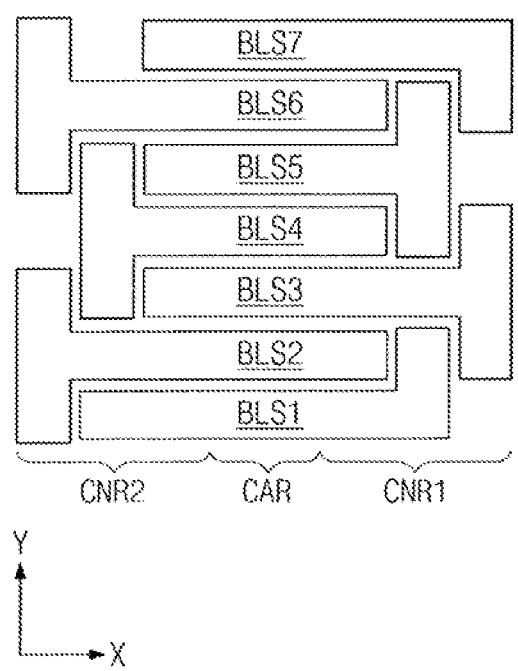

FIGS. 24 and 25 illustrate plan views of portions of a three-dimensional semiconductor memory device according to example embodiments.

Referring to FIG. 24, block structures BLS1-BL6 may form an interlocking structure. For example, each of the outermost ones (e.g., the first block structure BLS1 and the sixth block structure BLS6) of the block structures BLS1-BL6 may have an 'L'-shaped planar structure. Each of other block structures (e.g., the second to fifth block structures BLS2-BLS5) between them may have a 'T'-shaped planar structure.

Referring to FIG. 25, block structures BLS1-BL7 may form an interlocking structure. For example, each of the outermost ones (e.g., the first block structure BLS1 and the seven block structure BLS7) of the block structures BLS1-BL7 may have an 'L'-shaped planar structure. Each of other block structures (e.g., the second to sixth block structures BLS2-BLS6) between them may have a 'T'-shaped planar structure. However, some of the second to sixth block structures BLS2-BLS6 may be different from the others in terms of their length in the first direction X. For example, the second and sixth block structures BLS2 and BLS6 may be longer than the third to fifth block structures BLS3-BLS5.

By way of summation and review, in the case of two-dimensional or planar semiconductor devices, their integration may be mainly determined by the area occupied by a unit memory cell, and integration may be greatly influenced by the level of a fine pattern forming technology. Extremely expensive process equipment may be used to increase pattern fineness and may set a practical limitation on increasing integration for two-dimensional or planar semiconductor devices. Three-dimensional semiconductor memory devices including three-dimensionally arranged memory cells may be considered.

According to some embodiments, a shape of a block structure on a connection region may be changed to increase an area of pad regions. Thus, it may be possible to prevent a bridge issue between contact plugs and to increase a degree of freedom in constructing a routing structure. This may make it possible to realize a highly reliable three-dimensional semiconductor memory device.

In addition, the number of stair dividing patterns may be increased above the number of string selection lines, and block structures may be provided to have an interlocking structure. Thus, it may be possible to reduce a total area of a semiconductor memory device, and this may be advantageous in increasing an integration density of a semiconductor memory device.

One or more embodiments may provide a three-dimensional semiconductor memory device with an increased integration density.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A three-dimensional semiconductor memory device, comprising:
a substrate including a cell array region and a first connection region arranged in a first direction; and
a first block structure on the substrate, the first block structure including:
a cell array portion on the cell array region;
a first connecting portion on the first connection region and adjacent to the cell array portion in the first direction; and
a second connecting portion on the first connection region and adjacent to the first connecting portion in a second direction crossing the first direction,
wherein:
the second connecting portion is symmetric with respect to the first connecting portion in a plan view and has a height difference from the first connecting portion in a side view,
the first connecting portion includes first electrodes, which are vertically stacked to form an upward staircase structure in the second direction,
the second connecting portion includes second electrodes, which are vertically stacked to form an upward staircase structure in a direction opposite to the second direction, and
a topmost step of the upward staircase structure of the second connecting portion is lower than a bottommost step of the upward staircase structure of the first connecting portion.

2. The device as claimed in claim 1, wherein:
some of the second electrodes extend to a region below the first electrodes.

3. The device as claimed in claim 2, wherein others of the second electrodes extend to regions between some of the first electrodes.

4. The device as claimed in claim 2, wherein:
the cell array portion includes third electrodes, which are spaced apart from each other in the second direction and are located at a same level, and
a number of the third electrodes is equal to or smaller than a sum of a number of the first electrodes and a number of the second electrodes.

5. The device as claimed in claim 2, wherein:
the first electrodes include first lower electrodes, which are vertically stacked on the substrate, and first upper electrodes, which are vertically stacked on the first lower electrodes, and
the first lower electrodes are offset from the first upper electrodes in the first direction.

6. The device as claimed in claim 1, wherein:
the first block structure further includes a third connecting portion, which is adjacent to the first connecting portion in a direction opposite to the second direction on the first connection region, and
the second connecting portion is symmetric with respect to the third connecting portion in a plan view and has a height difference relative to the first connecting portion in a side view.

7. The device as claimed in claim 1, further comprising a second block structure, which is on the substrate and is spaced apart from the first block structure, wherein the second block structure has a symmetric structure with respect to the first block structure.

* * * * *